United States Patent
Kim et al.

(10) Patent No.: US 9,864,682 B2
(45) Date of Patent: Jan. 9, 2018

(54) NONVOLATILE MEMORY DEVICE AND STORAGE DEVICE HAVING THE SAME AND OPERATION METHOD THEREOF

(71) Applicants: Doohyun Kim, Ansan-si (KR); BoGeun Kim, Suwon-si (KR); Kitae Park, Seongnam-si (KR); Jinman Han, Seongnam-si (KR)

(72) Inventors: Doohyun Kim, Ansan-si (KR); BoGeun Kim, Suwon-si (KR); Kitae Park, Seongnam-si (KR); Jinman Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 14/664,125

(22) Filed: Mar. 20, 2015

(65) Prior Publication Data
US 2015/0270008 A1 Sep. 24, 2015

(30) Foreign Application Priority Data

Mar. 21, 2014 (KR) .......................... 10-2014-0033483

(51) Int. Cl.
*G06F 12/02* (2006.01)
*G11C 11/56* (2006.01)
*G11C 16/04* (2006.01)

(52) U.S. Cl.
CPC .. *G06F 12/0246* (2013.01); *G06F 2212/7201* (2013.01); *G11C 11/5621* (2013.01); *G11C 16/0483* (2013.01)

(58) Field of Classification Search
CPC ............. G06F 12/0246; G11C 11/5621; G11C 16/0483

USPC .................................................... 711/103, 125
See application file for complete search history.

(56) References Cited

U.S. PATENT DOCUMENTS

| | | | |
|---|---|---|---|
| 7,679,133 B2 | 3/2010 | Son et al. | |
| 7,852,676 B2 | 12/2010 | Maejima | |
| 7,859,902 B2 | 12/2010 | Maejima | |
| 7,983,084 B2 | 7/2011 | Tokiwa et al. | |
| 8,081,519 B2 * | 12/2011 | Lee ..................... | G11C 11/5635 365/185.18 |
| 8,218,358 B2 | 7/2012 | Katsumata et al. | |
| 8,427,878 B2 | 4/2013 | Shim et al. | |
| 8,488,402 B2 * | 7/2013 | Shim ....................... | G11C 7/12 365/185.11 |
| 8,553,466 B2 | 10/2013 | Han et al. | |
| 8,559,235 B2 | 10/2013 | Yoon et al. | |
| 8,625,351 B2 * | 1/2014 | Park ................... | G11C 16/0483 365/185.17 |

(Continued)

FOREIGN PATENT DOCUMENTS

KR   2015-0070746 A   6/2015

*Primary Examiner* — Pierre-Michel Bataille
(74) *Attorney, Agent, or Firm* — Harness, Dickey, & Pierce, P.L.C.

(57) ABSTRACT

According to example embodiments, a method of operating a storage device includes reading a process capability index using a memory controller, adjusting at least one operation condition based on the process capability index, and operating one of at least one nonvolatile memory device according to the at least one operation condition adjusted. The process capability index indicates how a structure associated with a memory cell to be operated deviates from a target shape.

19 Claims, 21 Drawing Sheets

| Level Compensation | Program | Read | Erase |
|---|---|---|---|
| PCI = 0 | Vpgm<br>Vpass | Vr<br>Vread | Vers |
| 0 < PCI ≤ C1 | Vpgm - ΔVpgm1<br>Vpass - ΔVpass1 | Vr - ΔVr1<br>Vr - ΔVread1 | Vers - ΔVers1 |
| C1 < PCI ≤ C2 | Vpgm - ΔVpgm1<br>Vpass - ΔVpass1 | Vr - ΔVr2<br>Vread - ΔVread2 | Vers - ΔVers2 |
| ⋮ | ⋮ | ⋮ | ⋮ |
| Ck-1 < PCI ≤ Ck | Vpgm - ΔVpgmk<br>Vpass - ΔVpassk | Vr - ΔVrk<br>Vread - ΔVreadk | Vers - ΔVersk |

(56) References Cited

U.S. PATENT DOCUMENTS

| | | | |
|---|---|---|---|
| 8,654,587 B2 | 2/2014 | Yoon et al. | |
| 8,819,503 B2 * | 8/2014 | Melik-Martirosian | G06F 11/3034 714/704 |
| 9,036,415 B2 * | 5/2015 | Sharon | G06F 11/1072 365/185.01 |
| 9,324,440 B2 * | 4/2016 | Park | G11C 16/14 |
| 9,401,216 B1 * | 7/2016 | Yang | G11C 29/88 |
| 2005/0144576 A1 * | 6/2005 | Furuta | G06F 17/5045 327/513 |
| 2009/0268523 A1 | 10/2009 | Maejima | |
| 2009/0268524 A1 | 10/2009 | Maejima | |
| 2010/0097858 A1 | 4/2010 | Tokiwa et al. | |
| 2011/0103153 A1 | 5/2011 | Katsumata et al. | |
| 2011/0199833 A1 | 8/2011 | Shim et al. | |
| 2011/0205796 A1 * | 8/2011 | Kim | G11C 29/846 365/185.09 |
| 2011/0233648 A1 | 9/2011 | Seol et al. | |
| 2012/0140562 A1 | 6/2012 | Choe et al. | |
| 2012/0224426 A1 | 9/2012 | Nam et al. | |
| 2013/0028027 A1 | 1/2013 | Kim et al. | |
| 2013/0201743 A1 | 8/2013 | Zhang | |
| 2013/0235667 A1 | 9/2013 | Nam et al. | |
| 2013/0242675 A1 | 9/2013 | Kwak et al. | |
| 2013/0308363 A1 | 11/2013 | Scheuerlein et al. | |
| 2014/0229774 A1 * | 8/2014 | Melik-Martirosian | G06F 11/076 714/704 |

* cited by examiner

FIG. 11

| Level Compensation | Program | Read | Erase |
|---|---|---|---|
| PCI = 0 | Vpgm<br>Vpass | Vr<br>Vread | Vers |
| 0 < PCI ≤ C1 | Vpgm − ΔVpgm1<br>Vpass − ΔVpass1 | Vr − ΔVr1<br>Vread − ΔVread1 | Vers − ΔVers1 |
| C1 < PCI ≤ C2 | Vpgm − ΔVpgm1<br>Vpass − ΔVpass1 | Vr − ΔVr2<br>Vread − ΔVread2 | Vers − ΔVers2 |
| ⋮ | ⋮ | ⋮ | ⋮ |
| Ck−1 < PCI ≤ Ck | Vpgm − ΔVpgmk<br>Vpass − ΔVpassk | Vr − ΔVrk<br>Vread − ΔVreadk | Vers − ΔVersk |

FIG. 12

| Time Compensation | Program | Read | Erase |
|---|---|---|---|
| PCI = 0 | Tpgm<br>Tpass | Tr<br>Tread | Ters |
| 0 < PCI ≤ C1 | Tpgm − ΔTpgm1<br>Tpass − ΔTpass1 | Tr − ΔTr1<br>Tread − ΔTread1 | Ters − ΔTers1 |
| C1 < PCI ≤ C2 | Tpgm − ΔTpgm2<br>Tpass − ΔTpass2 | Tr − ΔTr2<br>Tread − ΔTread2 | Ters − ΔTers2 |
| ⋮ | ⋮ | ⋮ | ⋮ |
| Ck−1 < PCI ≤ Ck | Tpgm − ΔTpgmk<br>Tpass − ΔTpassk | Tr − ΔTrk<br>Tread − ΔTreadk | Ters − ΔTersk |

FIG. 14

| Verify Level Compensation | Program | Erase |
|---|---|---|
| PCI = 0 | VP1 ~ VPn | E_VFY0 |
| 0 < PCI ≤ C1 | VP1 − ΔVP1(1)<br>VP2 − ΔVP2(1)<br>⋮<br>VPn − ΔVPn(1) | E_VFY0 − ΔE_VFY(1) |
| C1 < PCI ≤ C2 | VP1 − ΔVP1(2)<br>VP2 − ΔVP2(2)<br>⋮<br>VPn − ΔVPn(2) | E_VFY0 − ΔE_VFY(2) |
| ⋮ | ⋮ | ⋮ |
| Ck−1 < PCI ≤ Ck | VP1 − ΔVP1(n)<br>VP2 − ΔVP2(n)<br>⋮<br>VPn − ΔVPn(n) | E_VFY0 − ΔE_VFY(n) |

FIG. 15

| Read Level Compensation | Read |
|---|---|
| $PCI = 0$ | $VR1 \sim VRn$ |
| $0 < PCI \leq C1$ | $VR1 - \Delta VR1(1)$<br>$VR2 - \Delta VR2(1)$<br>$\vdots$<br>$VRn - \Delta VRn(1)$ |
| $C1 < PCI \leq C2$ | $VR1 - \Delta VR1(2)$<br>$VR2 - \Delta VR2(2)$<br>$\vdots$<br>$VRn - \Delta VRn(2)$ |
| $\vdots$ | $\vdots$ |
| $Ck-1 < PCI \leq Ck$ | $VR1 - \Delta VR1(n)$<br>$VR2 - \Delta VR2(n)$<br>$\vdots$<br>$VRn - \Delta VRn(n)$ |

NONVOLATILE MEMORY DEVICE AND STORAGE DEVICE HAVING THE SAME AND OPERATION METHOD THEREOF

CROSS-REFERENCE TO RELATED APPLICATIONS

This application claims priority under 35 U.S.C. §119 to Korean Patent Application No. 10-2014-0033483, filed on Mar. 21, 2014, the subject matter of which is hereby incorporated by reference in its entirety.

BACKGROUND

The present disclosure relates to a nonvolatile memory device, a storage device including the same, and an operation method thereof.

Semiconductor memory devices may be classified as volatile semiconductor memory devices and nonvolatile semiconductor memory devices. The nonvolatile semiconductor memory devices may retain data stored therein even at power-off. Data stored in a nonvolatile semiconductor memory device may be permanent or reprogrammable, depending upon the fabrication technology used. Nonvolatile semiconductor memory devices may be used for user data storage, program, and microcode storage in a wide variety of applications in the computer, avionics, telecommunications, and consumer electronics industries.

SUMMARY

According to example embodiments of inventive concepts, a method of operating a storage device including at least one nonvolatile memory device and a memory controller configured to control the at least one nonvolatile memory device is provided. Each nonvolatile memory device includes a plurality of strings on a substrate. The strings are perpendicular to the substrate and connected between bit lines and a common source line. The operating method includes: reading a process capability index using the memory controller, the process capability index indicating how a structure associated with a memory cell to be operated deviates from a target shape; adjusting at least one operation condition based on the process capability index; and operating one of the at least one nonvolatile memory device according to the at least one operation condition adjusted.

In example embodiments, the reading the process capability index using the memory may include reading the process capability index read from the one of at least one nonvolatile memory device.

In example embodiments, the method may further include storing the process capability index in a table format in the one of the at least one nonvolatile memory device.

In example embodiments, the structure associated with the memory cell to be operated may be a channel of one of the plurality of strings in the one of the at least one nonvolatile memory device.

In example embodiments, the process capability index may be a value associated with a distance deviating from the target shape.

In example embodiments, the target shape may be one of a circle and an oval if the structure associated with the memory cell to be operated is a channel in one of the plurality of strings in the one of the at least one nonvolatile memory device.

In example embodiments, the process capability index may be a value associated with the size of an area deviating from the target shape.

In example embodiments, the process capability index may be managed using a table. The table may be divided into a plurality of groups according to a value of the process capability index. the table for managing the process capability index may be determined using location information of word lines belonging to the plurality of groups.

In example embodiments, the adjusting at least one operation condition based on the process capability index read may include adjusting one of an operation voltage and an operation time of at least one of a program operation, a read operation, and an erase operation according to each of the plurality of groups.

In example embodiments, the adjusting at least one operation condition based on the process capability index may include adjusting one of an operation voltage and an operation time of at least one of a program operation, a read operation, and an erase operation, based on the process capability index and at least one of an operation temperature, a deterioration level of an operation cell, information associated with an operation structure, and information associated with an operation location.

According to example embodiments of inventive concepts, a storage device includes at least one nonvolatile memory device and a memory controller. Each nonvolatile memory device includes a plurality of memory blocks on a substrate. Each memory block includes a plurality of strings on the substrate. The plurality of strings are perpendicular to the substrate and connected between bit lines and a common source line. The memory controller is configured to compensate for an operation condition of at least one of a program operation, a read operation, and an erase operation, based on a process capability index. The operation condition is one of an operation voltage and an operation time. The process capability index indicates how a structure associated with a memory cell to be operated deviates from a target shape.

In example embodiments, the storage device may be configured to store the process capability index in a table format in the at least one nonvolatile memory device.

In example embodiments, the storage device may be configured to store the process capability index in a table format in the memory controller.

In example embodiments, the capability index may be based on reference process capability indexes determined from a test wafer. The reference process capability indexes may correspond to locations of word lines in the test wafer.

In example embodiments, the memory controller may be configured to compensate for the operation condition based on the process capability index or environment information. The environment information may include at least one of an operation temperature, a deterioration level of an operation cell, information associated with an operation structure, and information associated with an operation location.

According to example embodiments of inventive concepts, a nonvolatile memory device includes a plurality of memory blocks; an address decoder; a voltage generation circuit, an input/output circuit; and a control logic. The nonvolatile memory device includes a plurality of strings stacked on each other and a plurality of strings. The word lines have a plate shape. Each string includes a pillar that penetrates the word lines. The address decoder is configured to select one of the memory blocks in response to an address. The voltage generation circuit is configured to generate word line voltages to be applied to word lines of the selected memory block. The input/output circuit is configured to read data stored in the selected memory block at a program operation and to store data read from the selected memory block at a read operation. The control logic is configured to control the address decoder, the voltage generation circuit, and the input/output circuit during at least one of the program operation and the read operation. The control logic is configured to receive operation condition adjustment information associated with a process capability index indicating how a structure associated with a memory cell to be operated deviates from a target shape. The control logic is configured to adjust at least one of an operation condition of the program operation and an operation condition of the read operation according to the operation condition adjustment information.

In example embodiments, the nonvolatile memory device may be configured to store a process capability index table associated with the process capability index.

In example embodiments, the control logic is configured to adjust at least ones of generation times of the word line voltages, levels of the word line voltages, and applying times of the word lines based on the operation condition adjustment information.

In example embodiments, the process capability index may be an index associated with a cross section of the pillar penetrating the word lines.

In example embodiments, each of the memory blocks has a P-BiCS structure.

According to example embodiments, a nonvolatile memory device includes a memory cell array including a plurality of strings spaced apart from each other on a substrate, an address decoder connected to the strings through a plurality of word lines, and a control logic. Each string includes a plurality of memory cells stacked on each other between a ground select transistor and a string select transistor. Each word line is connected to at least two of the memory cells at a same height of at least two of the strings. The control logic is configured to receive operation condition adjustment information associated with a process capability index indicating how a structure associated with one of the memory cells in one of the strings of the memory cell array deviates from a target shape. The control logic is configured to adjust at least one driving condition applied to the memory cell array according to the operation condition adjustment information.

In example embodiments, the process capability index may indicate how a cross-sectional area of the one of the memory cells in the one of the strings of the memory cell array deviates from a target area.

In example embodiments, the nonvolatile memory device may be configured to store values for the process capability index in a table. The table may be divided into a plurality of groups according to the values for the process capability index.

In example embodiments, the control logic may be configured to adjust one of a level of an applied voltage to the memory cell array and an application time of the applied voltage to the memory cell array according to the operation condition adjustment information.

In example embodiments, a storage device may include the nonvolatile memory device and a memory controller. The memory controller may be configured to read the process capability index from the nonvolatile memory device. The memory controller may be configured to provide the operation condition adjustment information to the control logic in response to the read process capability index.

BRIEF DESCRIPTION OF THE FIGURES

The above and other features of inventive concepts will become apparent from the following description of non-limiting example embodiments of inventive concepts, as illustrated in the following figures, wherein like reference numerals refer to like parts throughout the various figures unless otherwise specified, and wherein

FIG. 11 is a table schematically illustrating conditions for compensating for operation-voltage levels based a process capability index according to example embodiments of inventive concepts;

FIG. 12 is a table schematically illustrating conditions for compensating for operation times based a process capability index according to example embodiments of inventive concepts;

FIG. 14 is a table showing conditions for compensating for verification levels based on a process capability index according to example embodiments of inventive concepts;

FIG. 15 is a table showing conditions for compensating for read levels based on a process capability index according to example embodiments of inventive concepts;

DETAILED DESCRIPTION

Figure 1:
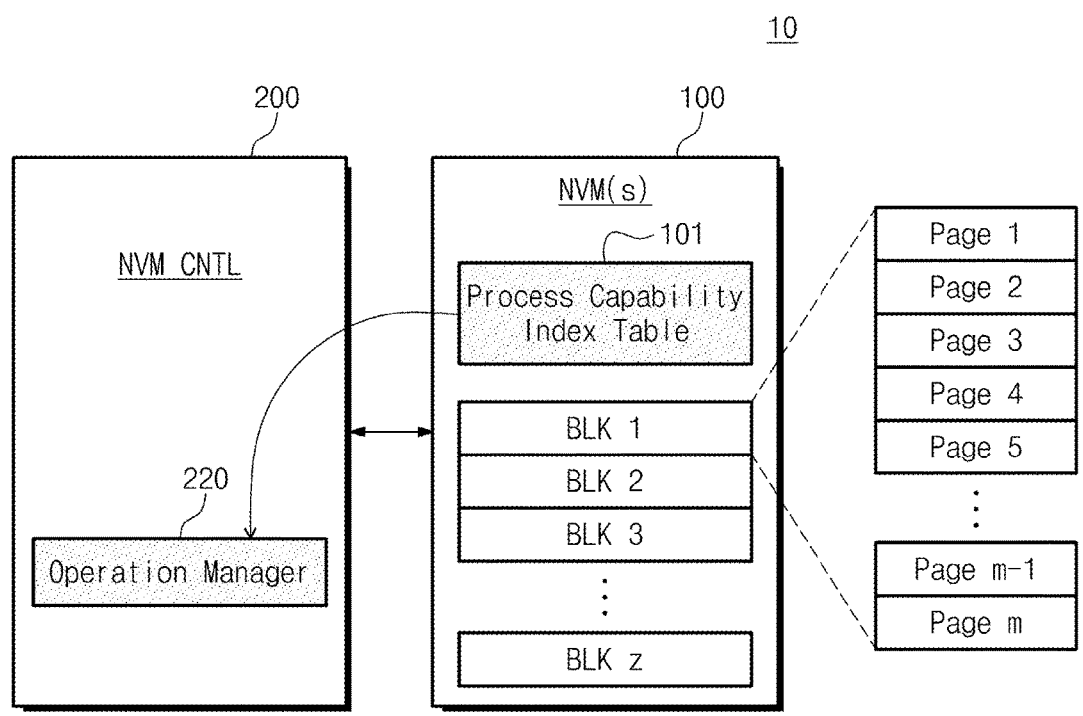
FIG. 1 is a diagram of a storage device according to example embodiments of inventive concepts.

Example embodiments will be described in detail with reference to the accompanying drawings. Example embodiments, however, may be embodied in various different forms, and should not be construed as being limited only to the illustrated embodiments. Rather, these embodiments are provided as examples so that this disclosure will be thorough and complete, and will fully convey the scope of inventive concepts to those skilled in the art. Accordingly, known processes, elements, and techniques may be omitted in order to avoid obscuring the description of example embodiments of inventive concepts. In the drawings, the thicknesses of layers and regions are exaggerated for clarity. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A nonvolatile memory device according to example embodiments of inventive concepts may adjust at least one operation condition according to a process capability index PCI. The term "adjust" may be replaced with terms "control", "vary", "correct", "compensate", and so on. The process capability index PCI may be a value indicating how a manufactured shape deviates from a target shape (one-dimension/two-dimension/three-dimension) to be manufactured, and may be calculated or actually measured.

A nonvolatile memory device may be formed of, but not limited to, a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Also, the nonvolatile memory device 100 may be implemented to have a three-dimensional array structure. In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Example embodiments of inventive concepts are applicable to a Charge Trap Flash (CTF) memory device, in which a charge storage layer is made up of an insulation film, as well as a flash memory device, in which a charge storage layer is made up of a conductive floating gate. Below, the nonvolatile memory device 100 may be a vertical NAND flash memory device (VNAND), but example embodiments are not limited thereto and the nonvolatile memory device 100 may alternatively be a different one of the above-discussed types of nonvolatile memory device.

FIG. 1 is a diagram of a storage device according to example embodiments of inventive concepts. Referring to FIG. 1, a storage device 10 incorporates at least one nonvolatile memory device 100 and a memory controller 200 controlling the same.

The nonvolatile memory device 100 includes a plurality of memory blocks BLK1 to BLKz (z being an integer of 2 or more). Each of the memory blocks BLK1 to BLKz includes a plurality of pages Page 1 to Page m (m being an integer of 2 or more).

The nonvolatile memory device 100 stores a process capability index table 101 that stores a process capability index PCI. In example embodiments, the process capability index table 101 may include a process capability index PCI on each memory block. In example embodiments, the process capability index table 101 may include a process capability index PCI on each page of the memory blocks BLK1 to BLKz. Or, the process capability index table 101 may include group information associated with block/page groups that are partitioned according to the process capability index PCI.

In example embodiments, the process capability index table 101 may be stored by a manufacturer of the nonvolatile memory device 100.

In example embodiments, the process capability index table 101 may be provided from an external host and then stored through the memory controller 200.

In example embodiments, information of the process capability index table 101 may be calculated or actually measured during a wafer test operation associated with the nonvolatile memory device 100.

The memory controller 200 reads the process capability index table 101 from the nonvolatile memory device 100. The memory controller 200 incorporates an operation manager 220 that adjusts at least one operation condition (e.g., voltages, times, and so on) according to the process capability index table 101 thus read. The operation manager 220 may be implemented with hardware, software, and/or firmware.

According to example embodiments of inventive concepts, the storage device 10 may adjust an operation condition (e.g., program, read, and/or erase conditions) according to the process capability index PCI, so it operates under an optimal operation condition even though a shape deviates from a target shape due to process conditions, process environments, and process variables.

Figure 2:
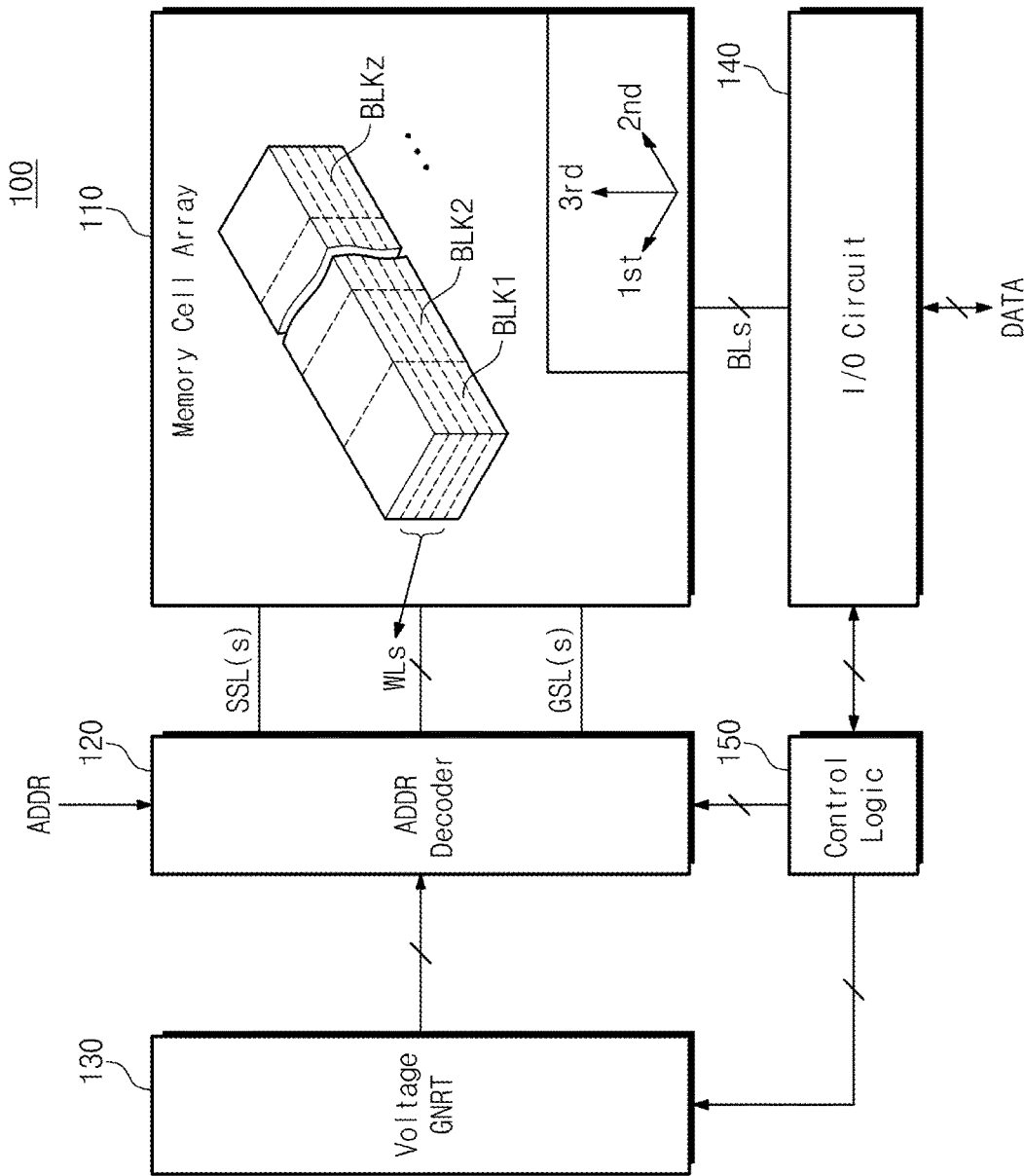
FIG. 2 is a block diagram schematically illustrating a nonvolatile memory device according to example embodiments of inventive concepts.

FIG. 2 is a block diagram schematically illustrating a nonvolatile memory device according to example embodiments of inventive concepts. Referring to FIG. 2, a nonvolatile memory device 100 contains a memory cell array 110, an address decoder 120, a voltage generation circuit 130, an input/output circuit 140, and control logic 150.

The memory cell array 110 includes a plurality of memory blocks BLK1 to BLKz (z being an integer of 2 or more), each of which is connected to the address decoder 120 via word lines, at least one string selection line SSL, and at least one ground selection line GSL and to the input/output circuit 140 via bit lines. In example embodiments, the word lines may be formed to have a shape where plates are stacked.

The memory blocks BLK1 to BLKz may include a plurality of strings that are vertically arranged on a substrate along a first direction and a second direction different from the first direction and along a third direction (e.g., a direction perpendicular to a plane formed in the first and second directions). Herein, each string may contain at least one string selection transistor, a plurality of memory cells, and at least one ground selection transistor connected in series in a direction perpendicular to the substrate. Each memory cell may store one or more bits. In example embodiments, at least one dummy cell may be provided between at least one string selection transistor and a plurality of memory cells and/or at least one dummy cell may be provided between a plurality of memory cells and at least one ground selection transistor.

The address decoder 120 selects one of the memory blocks BLK1 to BLKz in response to an address (e.g., address command received from control logic 150). The address decoder 120 is connected to the memory cell array 110 through the word lines, the at least on string selection line SSL, and the at least one ground selection line GSL. The address decoder 120 selects the word lines, the at least one string selection line SSL, and the at least one ground selection line GSL using a decoded row address. The address decoder 120 decodes a column address of an input address. Herein, the decoded column address may be transferred to the input/output circuit 140. In example embodiments, the address decoder 120 may include, but not limited to, a row decoder, a column decoder, an address buffer, and so on.

The voltage generation circuit 130 generates driving voltages, such as a program voltage, a pass voltage, a read voltage, a read pass voltage, a verification voltage, an erase operation, a common source line voltage, a well voltage, and so on. The voltage generation circuit 130 also generates a word line voltage for a program, read, and/or erase operation.

Under a control of the control logic 150, the voltage generation circuit 130 generates a word line voltage that has an offset pulse selectively. That is, the voltage generation circuit 130 may generate either a word line voltage having an offset pulse or a word line voltage not having an offset pulse.

The input/output circuit 140 is connected to the memory cell array 110 through the bit lines BLs. The input/output circuit 140 is configured to receive the decoded column address from the address decoder 120. The input/output circuit 140 selects the bit lines using the decoded column address.

The input/output circuit 140 may contain a plurality of page buffers that store program data at a program operation and reads data at a read operation. Each of the page buffers may include a plurality of latches. During a program operation, data stored in the page buffers may be programmed at a page of a selected memory block. During a read operation, data read from a page of a selected memory block may be stored in the page buffers via the bit lines. Meanwhile, the input/output circuit 140 reads data from a first area of the memory cell array 110 and then stores the read data in a second area of the memory cell array 110. For example, the input/output circuit 140 is configured to perform a copy-back operation.

The control logic 150 controls an overall operation of the VNAND 100, including, but not limited to, a program operation, a read operation, and an erase operation. The control logic 150 operates in response to control signals and/or commands that may be provided from the external device. The control logic 150 controls the address decoder 120, the voltage generation circuit 130, and the input/output circuit 140 at a program, erase, and/or read operation.

The control logic 150 is configured to adjust at least one driving condition based on operation condition adjustment information that a memory controller 200 (refer to FIG. 1) provides at program, erase, and/or read operation. The operation condition adjustment information may include a process capability index PCI.

In example embodiments, a process capability index may be stored in the nonvolatile memory device 100 in a table format.

In example embodiments, a process capability index may be stored in a memory block of the nonvolatile memory device 100 in a table format.

In example embodiments, a process capability index may be calculated at a wafer test operation.

In example embodiments, the memory controller 200 may use at least one of an operation temperature, a deterioration level of an operation cell, operation structure related information, and operation position related information to compensate for an operation voltage or an operation time.

In example embodiments, the operation condition adjustment information may be used to adjust at least one of generation times of word line voltages, levels of word line voltages, and applying times of word line voltages.

In example embodiments, the process capability index may be associated with a cross section of a pillar that penetrates word lines.

The nonvolatile memory device 100 according to example embodiments of inventive concepts may adjust an operation condition of at least one of program, read, and erase operations according to the process capability index PCI.

Figure 3:
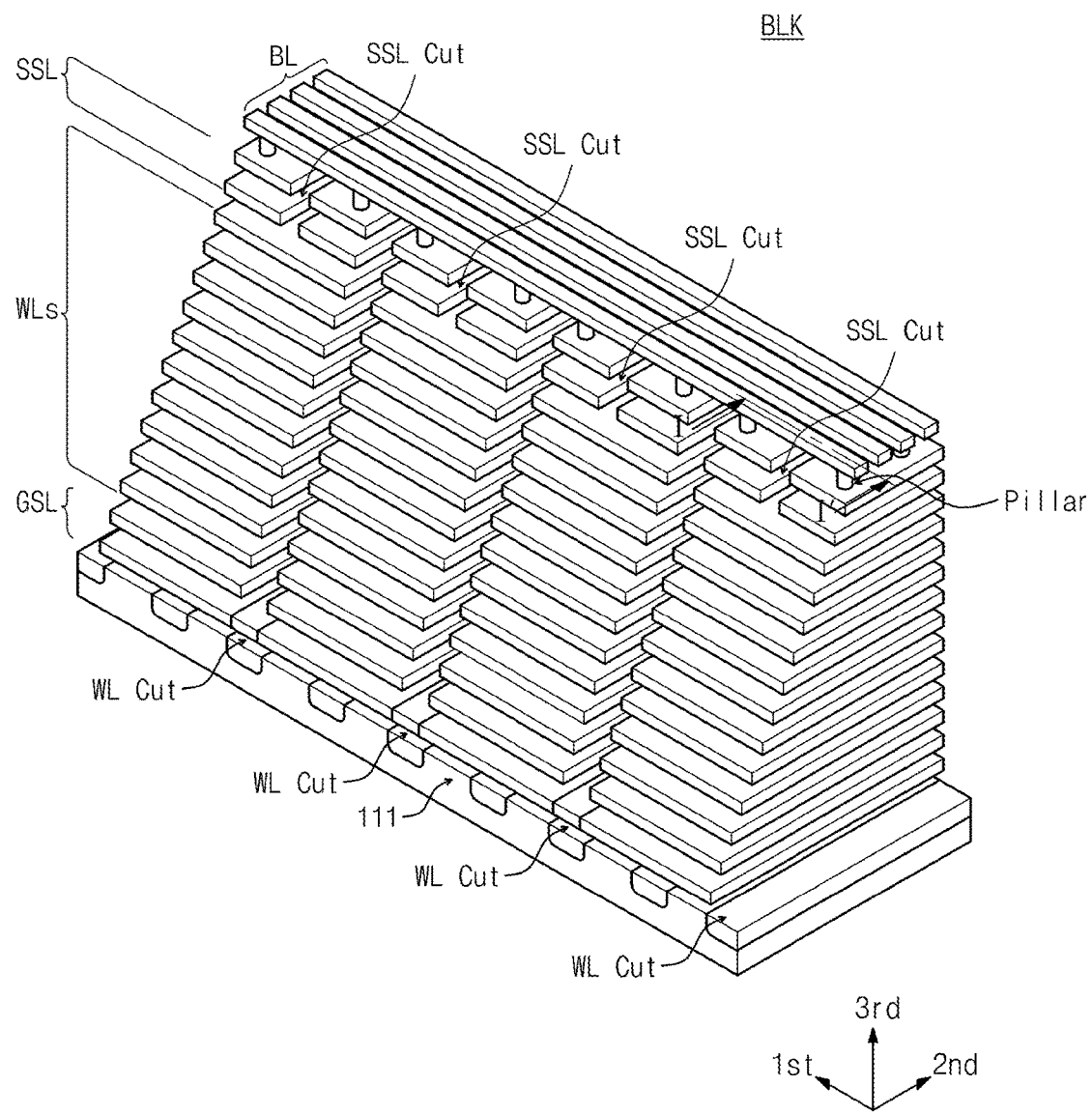
FIG. 3 is a perspective view of a memory block shown in FIG. 2.

FIG. 3 is a perspective view of a memory block BLK shown in FIG. 2. Referring to FIG. 3, four sub blocks may be formed on a substrate. Each sub block is formed by stacking and cutting at least one ground selection line GSL, a plurality of word lines, and at least one string selection line SSL on the substrate in a plate shape. Herein, the at least one string selection line SSL is separated by string selection line cuts. A common source line CSL may be formed on inner walls of the word line cuts in a wall shape.

In example embodiments, at least one plate-shaped dummy line may be formed between the ground selection line GSL and the word lines. Or, at least one plate-shaped dummy line may be formed between the word lines and the string selection line SSL.

Although not shown in FIG. 3, each word line cut may include a common source line CSL. In example embodiments, the common source lines CSL included in the word line cuts may be interconnected. A string may be formed by making a pillar connected to a bit line penetrate the at least one string selection line SSL, the word lines, and the at least one ground selection line GSL.

In FIG. 3, a memory block BLK is illustrated as being formed of four sub blocks. However, example embodiments of inventive concepts are not limited thereto.

In FIG. 3, there is illustrated an example in which a structure between word line cuts adjacent to each other is a sub block. However, example embodiments of inventive concepts are not limited thereto. For example, a structure between a word line cut and a string selection line cut may be defined as a sub block.

The memory block BLK according to example embodiments of inventive concepts may be implemented to have a merged word line structure where two word lines are merged to one.

Figure 4:
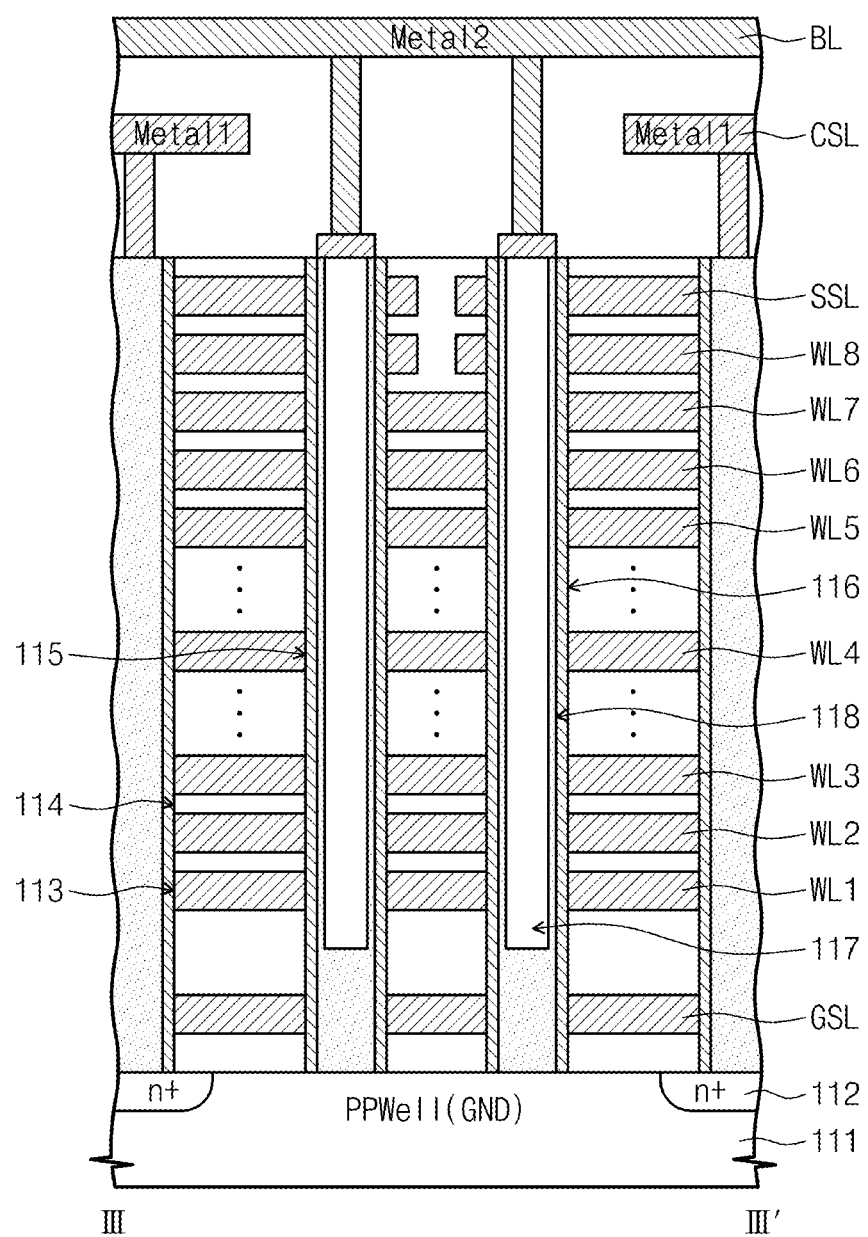
FIG. 4 is a cross-sectional view taken along a line IV-IV' of a memory block shown in FIG. 3.

FIG. 4 is a cross-sectional view taken along a line IV-IV' of a memory block shown in FIG. 3. Referring to FIG. 4, a memory block BLK is formed in a direction perpendicular to a substrate 111. An n+ doping region 112 may be formed in the substrate 111.

A plurality of gate electrode layers 113 and insulation layers 114 may be deposited on the substrate 111 in turn. An information storage layer 115 may be formed on lateral surfaces of the gate electrode layers 113 and the insulation layers 114.

The gate electrode layer 113 may be connected to a ground selection line GSL, a plurality of word lines WL1 to WL8, and a string selection line SSL.

The information storage layer 115 may include a tunnel insulation layer, a charge storage layer, and a blocking insulation layer. The tunnel insulation layer may act as an insulation layer where charge moves due to the tunneling effect. The charge storage layer may be made up of an insulation layer that traps charge. The charge storage layer may be formed of SiN or a metal (e.g., aluminum or hafnium) oxide layer. The blocking insulation layer may act as an insulation layer between the gate electrode layer and the charge storage layer. The blocking insulation layer may be formed of a dielectric material, such as a silicon oxide layer. In example embodiments, the tunnel insulation layer, charge storage layer, and blocking insulation layer may be an ONO (Oxide-Nitride-Oxide) structure of insulation layers.

A pillar 116 may be formed by vertically patterning the gate electrode layers 113 and the insulation layers 114. A plurality of pillars 116 may penetrate the gate electrode layers 113 and insulation layers 114.

The pillar 116 penetrates the gate electrode layers 113 and the insulation layers 114 and may be connected between a bit line and the substrate 111. The inside of the pillar 116 forms a filing dielectric pattern and may be made up of an insulation material such as silicon oxide or air gap. The outside of the pillar 116 forms a vertical active pattern 118 and may be made up of channel semiconductor. In example embodiments, the vertical active pattern 118 may be formed of a p-type silicon layer. A memory cell included in a string may be defined by parts of dielectric pattern 117, the vertical active pattern 118, the information storage layer 115, and the gate electrode layer 113 that may be disposed sequentially from the inside of the pillar 116.

Common source lines CSL extend on the n+ doping regions 112. The common source lines CSL may be included in word line cuts in a wall shape.

Figure 5:
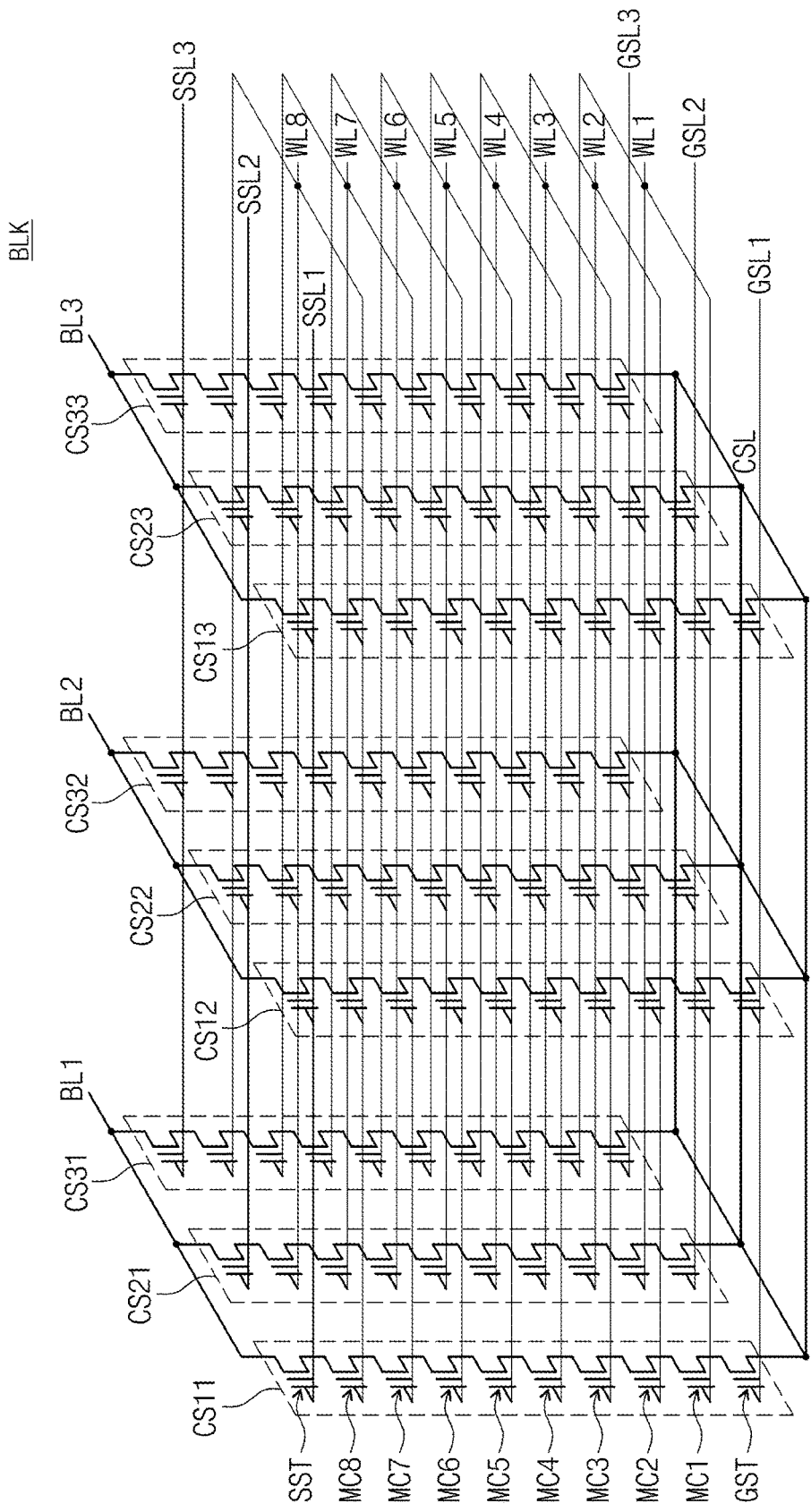
FIG. 5 is a circuit diagram schematically illustrating an equivalent circuit of a memory block shown in FIG. 3, according to example embodiments of inventive concepts.

FIG. 5 is a circuit diagram schematically illustrating an equivalent circuit of a memory block BLK shown in FIG. 3, according to example embodiments of inventive concepts. Referring to FIG. 5, cell strings CS11 to CS33 are connected between bit lines BL1 to BL3 and a common source line CSL. Each cell string (e.g., CS11) includes a string selection transistor SST, a plurality of memory cells MC1 to MC8, and a ground selection transistor GST. In FIG. 5, there is illustrated an example in which a string includes eight memory cells. However, example embodiments of inventive concepts are not limited thereto.

The string selection transistors SST are connected to a string selection line SSL. The string selection line SSL are divided into first to third string selection lines SSL1 to SSL3. In FIG. 5, there are illustrated three string selection line SSL1 to SSL3 corresponding to a bit line. However, example embodiments of inventive concepts are not limited thereto. The memory block BLK may be implemented to include at least two string selection lines corresponding to a bit line.

The ground selection transistors GST are connected to a ground selection line GSL. The ground selection line GSL may be divided into first to third ground selection lines GSL1 to GSL3. In FIG. 5, there are illustrated three ground selection lines GSL1 to GSL3 corresponding to a bit line. However, example embodiments of inventive concepts are not limited thereto. The memory block BLK may be implemented to include at least two ground selection lines corresponding to a bit line. Meanwhile, the ground selection lines GSL1 to GSL3 may be connected electrically in common.

Also, the string selection transistors SST are connected to bit lines BL1 to BL3, and the ground selection transistors GST are connected to the common source line CSL.

In each string, the memory cells MC1 to MC8 are connected to corresponding word lines WL1 to WL8. A set of memory cells that are connected to a word line and programmed at the same time may be referred to as a page. The memory block BLK is formed of a plurality of pages. Also, a word line is connected with a plurality of pages. Referring to FIG. 5, a word line (e.g., WL4) with the same height from the common source line CSL is connected in common to three pages. In other words, a word line (e.g., WL4) with the same height from the substrate may be connected in common to three pages.

Meanwhile, each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell.

A nonvolatile memory device 100 may be implemented with a charge trap flash (CTF) memory device. In this case, there may be generated such an initial verify shift (IVS) phenomenon that charge trapped in programmed CTF is redistributed and leaked by lapse of time. Reprogramming may be performed to overcome such distribution deterioration.

Figure 6:
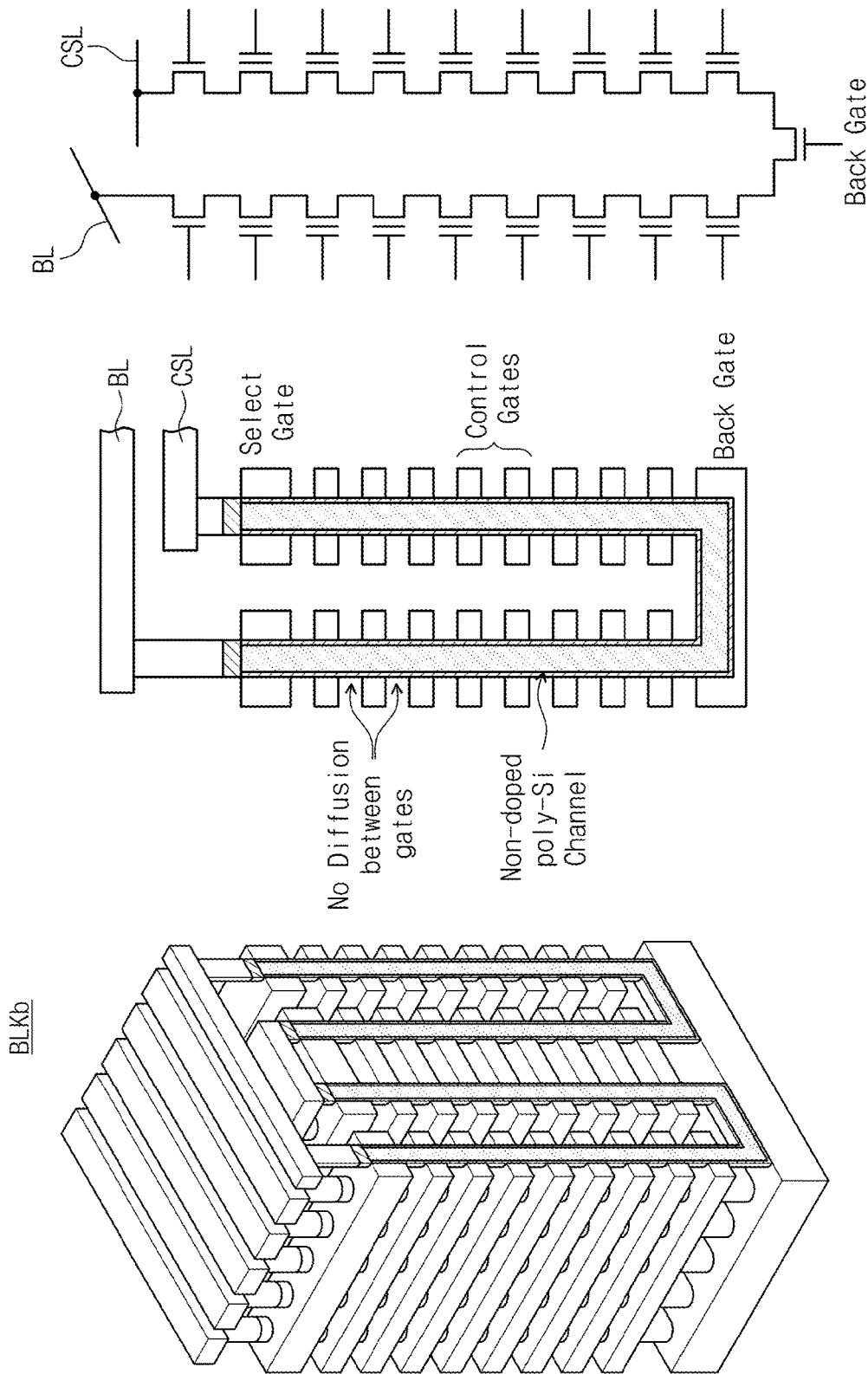
FIG. 6 is a diagram schematically illustrating a memory block according to example embodiments of inventive concepts.

FIG. 6 is a diagram schematically illustrating a memory block according to example embodiments of inventive concepts. Referring to FIG. 6, a string may be formed between a bit line BL and a common source line CSL and may include first memory cells formed between the bit line BL and a substrate in a vertical direction and second memory cells formed between the substrate and a common source line CSL in the vertical direction. That is, the string has a U-type pipe shape.

In example embodiments, a memory block BLKb may have a Pipe-shaped Bit Cost Scalable (P-BiCS) structure.

Figure 7:
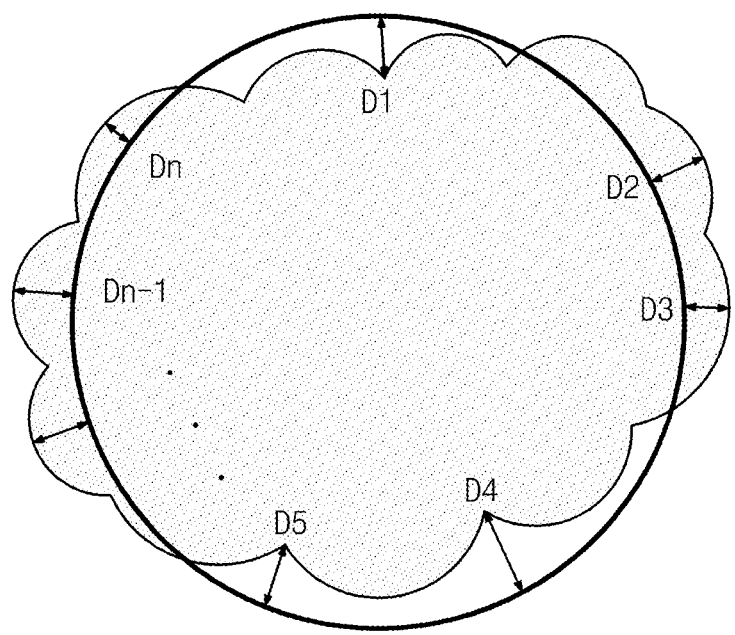
FIG. 7 is a cross-sectional view of a channel of a memory cell, according to example embodiments of inventive concepts.

FIG. 7 is a cross-sectional view of a channel of a memory cell, according to example embodiments of inventive concepts. Referring to FIG. 7, a process capability index PCI may be expressed by the following equation (1).

$$PCI = \frac{\sum_{k=1}^{i} D_k}{i} \quad (1)$$

In the equation (1), "Dk" indicates a value obtained by measuring a distance between a manufactured shape and a target shape at a point, and "i" indicates the number of shortest distances Dk. For example, in a cross section of a channel, an average of shortest distances between a manufactured shape and a target shape that are measured at "i" points may be used as a process capability index PCI. For example, that the process capability index PCI is approximate to "0" may mean that a manufactured shape is similar to a target shape. Otherwise, the manufactured shape is determined as deviating from the target shape. Meanwhile, the process capability index PCI may be expressed by the equation (1), but it is not limited thereto. For example, in example embodiments, the process capability index PCI may be expressed using various equations such as variance, standard deviation, and so on.

In FIG. 7, a target shape of a channel is illustrated as being a circle. However, example embodiments of inventive concepts are not limited thereto. A target shape of a channel may be modified or changed variously.

Figure 8:
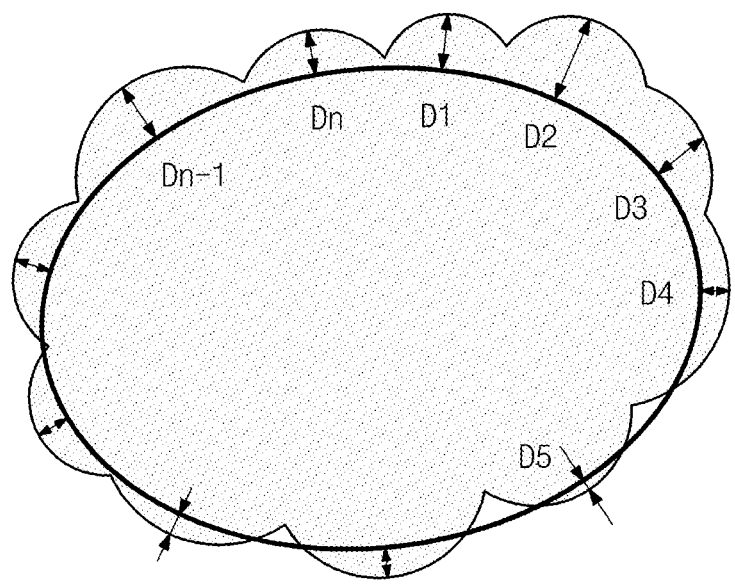
FIG. 8 is a diagram for describing a process capability index PCI on a channel having a target shape of an oval.

FIG. 8 is a diagram for describing a process capability index PCI on a channel having a target shape of an oval. Referring to FIG. 8, a process capability index PCI may be decided by an average of shortest distances between a manufactured shape and a target shape that are measured at "i" points.

Meanwhile, in FIGS. 7 and 8, the process capability index PCI may be used to indicate how a manufactured shape deviates from a target shape. However, example embodiments of inventive concepts are not limited thereto. For example, in example embodiments, the process capability index PCI of may be used to indicate a value associated with the size of an area that deviates from a target shape.

Figure 9:
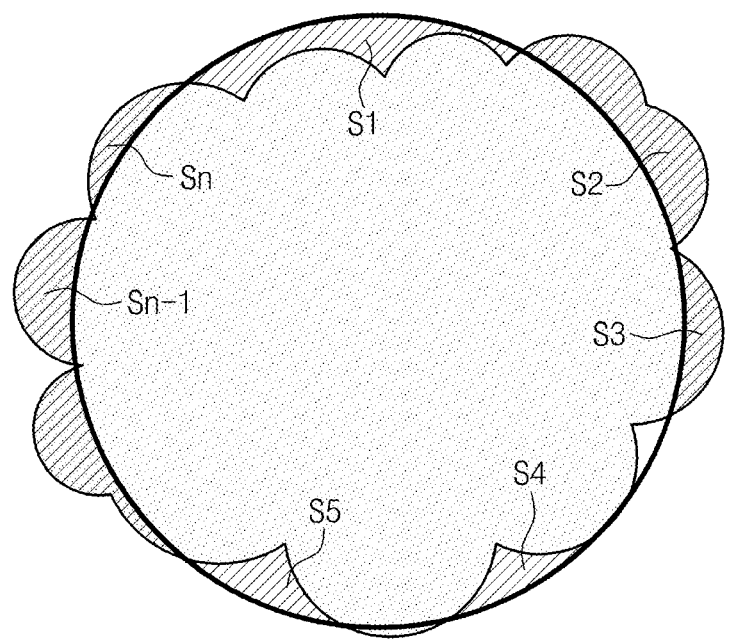
FIG. 9 is a cross-sectional view of a channel of a memory cell, according to example embodiments of inventive concepts.

FIG. 9 is a cross-sectional view of a channel of a memory cell, according to example embodiments of inventive concepts. Referring to FIG. 9, a process capability index PCI may be expressed using areas that defined by a curve of a channel and a target shape and measured at "i" points.

Meanwhile, in example embodiments, the process capability index PCI may be expressed by a value associated with shortest distances Dk described with reference to FIGS. 7 and 8 and a value associated with areas Sk described with reference to FIG. 9.

In FIGS. 7 to 9, the process capability index PCI may be expressed using a value associated with a curve of a channel. However, example embodiments of inventive concepts are not limited thereto. For example, in example embodiments, the process capability index PCI may be expressed using a value indicating how a component affecting an operation deviates from a target shape.

Figure 10:
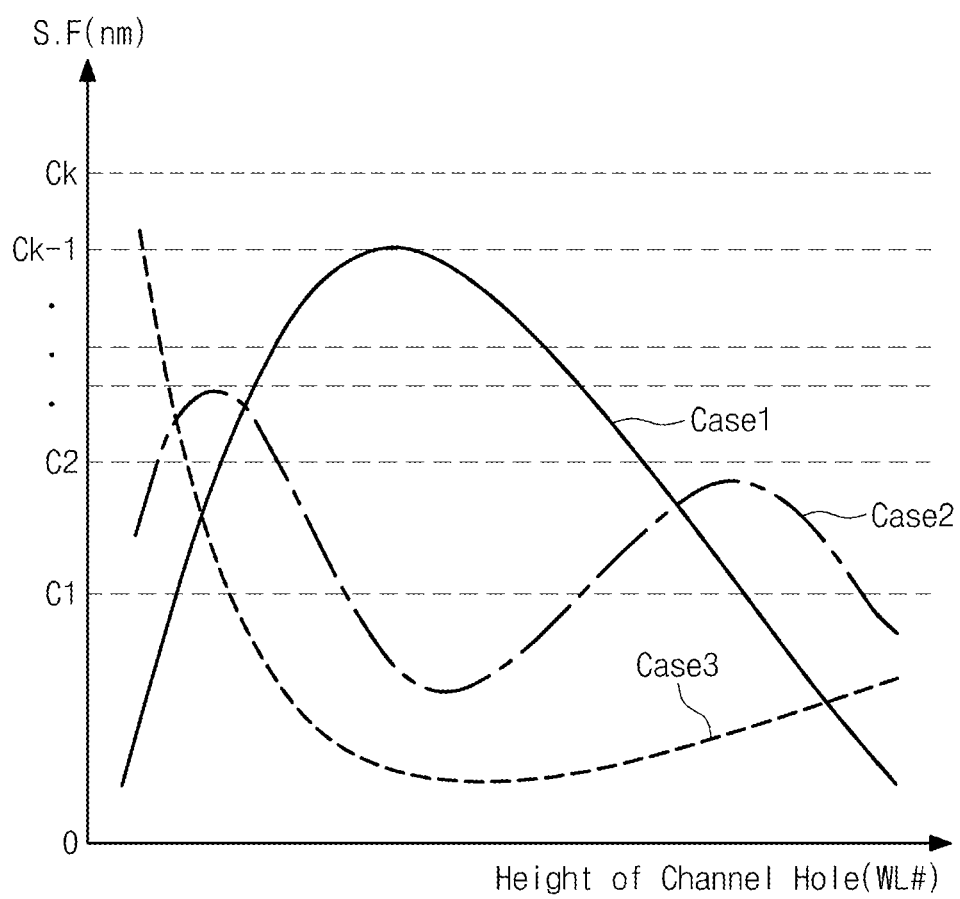
FIG. 10 is a diagram schematically illustrating a process capability index measured on the basis of heights of channel holes formed in a memory block.

FIG. 10 is a diagram schematically illustrating a process capability index PCI measured on the basis of heights of channel holes formed in a memory block. Referring to FIG. 10, a height of a channel hole may correspond to a location of a word line from a substrate. There may be variously expressed a process capability index PCI that may be measured according to a process environment, a process condition, or a process variable (Case 1 to Case 3). That is, a location of a word line that has the greatest process capability index PCI may vary according to a process environment, a process condition, or a process variable.

With a driving method of a nonvolatile memory device according to example embodiments of inventive concepts, process capability index groups are determined according to k reference values C1 to Ck (k being an integer of 2 or more), a process capability index table may be formed using location information of word lines belonging to each group, and an operation condition of at least one of program, read, and erase operations may be adjusted based on the process capability index table.

FIG. 11 is a table schematically illustrating conditions for compensating for operation-voltage levels based a process capability index PCI according to example embodiments of inventive concepts. Referring to FIG. 11, it is possible to compensate for operation voltages—a program voltage Vpgm and a pass voltage Vpass at a program operation, a read voltage Vr and a read pass voltage Vread at a read operation, and an erase voltage Vers at an erase operation— according to each group to which a process capability index PCI belongs.

Meanwhile, in FIG. 11, compensation for a negative voltage may be made according to a process capability index PCI. However, example embodiments of inventive concepts are not limited thereto. For example, compensation for a positive voltage may be made according to a process capability index PCI at a read, program, and/or erase operation. In FIG. 11, some or all of the values for $\Delta Vr1$ to $\Delta Vrk$ may be different from each other. In FIG. 11, some or all of the values for $\Delta Vread1$ to $\Delta Vreadk$ may be different from each other. In FIG. 11, some or all of the values for $\Delta Vers1$ to $\Delta Versk$ may be different from each other.

In FIG. 11, compensation for voltage level may be made according to the process capability index PCI. However, it is possible to make compensation for an operation time according to the process capability index PCI.

FIG. 12 is a table schematically illustrating conditions for compensating for operation times based a process capability index PCI according to example embodiments of inventive concepts. Referring to FIG. 12, it is possible to compensate for operation times—a program voltage applying time Tpgm and a pass voltage applying time Tpass at a program operation, a read voltage applying time Tr and a read pass voltage applying time Tread at a read operation, and an erase voltage applying time Ters at an erase operation—according to each group to which a process capability index PCI belongs.

Meanwhile, in FIG. 12, compensation for a negative time may be made according to a process capability index PCI. However, example embodiments of inventive concepts are not limited thereto. For example, compensation for a positive time may be made according to a process capability index PCI at a read, program, and/or erase operation. In FIG. 12, some or all the values for $\Delta Tr1$ to $\Delta Trk$ may be different from each other. In FIG. 12, some or all the values for $\Delta Tread1$ to $\Delta Treadk$ may be different from each other. In FIG. 12, some or all the values for $\Delta Ters1$ to $\Delta Tersk$ may be different from each other.

Referring to FIGS. 11 and 12, in example embodiments of inventive concepts, the driving method may make compensation for an operation-voltage level or an operation time according to a process capability index PCI.

With a driving method according to example embodiments of inventive concepts, compensation may be made according to a state of a memory cell, based on the process capability index PCI. Now will be described a method of compensating for a verification/read level according to a process capability index PCI every state of a memory cell with reference to FIGS. 13 to 15.

Figure 13:
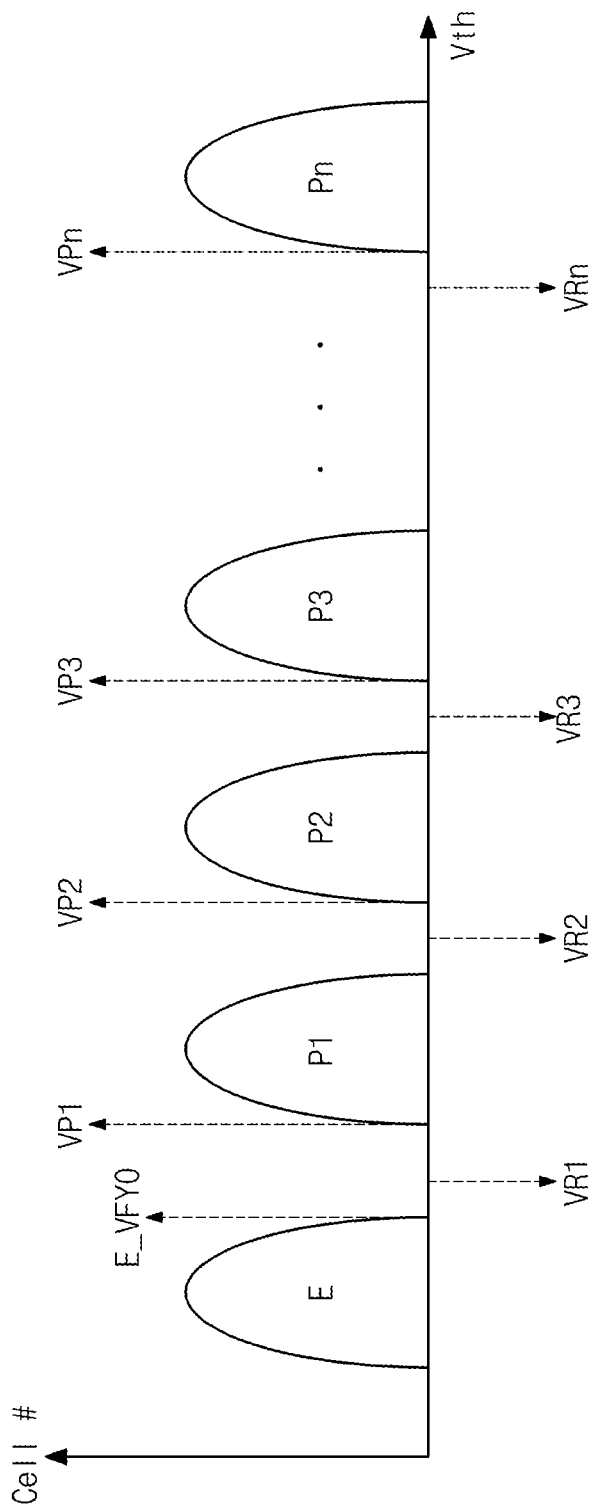
FIG. 13 is a diagram schematically illustrating threshold voltage distributions corresponding to states.

FIG. 13 is a diagram schematically illustrating threshold voltage distributions corresponding to states E and P1 to Pn (n being an integer of 2 or more). Referring to FIG. 13, "E_VFY0" indicates a verification voltage used to verify an erase state E. "VP1" to "VPn" indicate verification voltages used to verify program states P1 to Pn. "VR1" to "VRn" indicate read voltages for distinguishing the states E and P1 to Pn.

FIG. 14 is a table showing conditions for compensating for verification levels based on a process capability index PCI according to example embodiments of inventive concepts. Referring to FIG. 14, it is possible to make compensation for verification levels VP1 to VPn corresponding to program states P1 to Pn at a program operation according to each group to which a process capability index PCI belongs. Also, it is possible to make compensation for verification levels E_VRY0 corresponding to an erase state E at an erase operation according to each group to which a process capability index PCI belongs. In FIG. 14, some or all of the values for $\Delta VP1(1)$ to $\Delta VP1(n)$ may be different from each other, and some or all of the values for $\Delta E\_VFY(1)$ to $\Delta E\_VFY(n)$ may be different from each other. Similarly, some or all of the values for $\Delta VP2(1)$ to $\Delta VP2(n)$ may be different from each other, and some or all of the values for $\Delta VPn(1)$ to $\Delta VPn(n)$ may be different from each other.

FIG. 15 is a table showing conditions for compensating for read levels based on a process capability index PCI according to example embodiments of inventive concepts. Referring to FIG. 15, it is possible to make compensation for read levels VR1 to VRn corresponding to program states P1 to Pn at a read operation according to each group to which a process capability index PCI belongs. In FIG. 15, $\Delta VR1(1)$ to $\Delta VR1(n)$ may be different from each other. Similarly, $\Delta VR2(1)$ to $\Delta VR2(n)$ may be different from each other, and $\Delta VRn(1)$ to $\Delta VRn(n)$ may be different from each other.

To compensate for an operation voltage or an operation time according to a process capability index PCI has been described with reference to FIGS. 11 to 15. However, example embodiments of inventive concepts are not limited thereto. For example, it is possible to adjust a bias condition associated with an operation according to a process capability index PCI.

Figure 16:
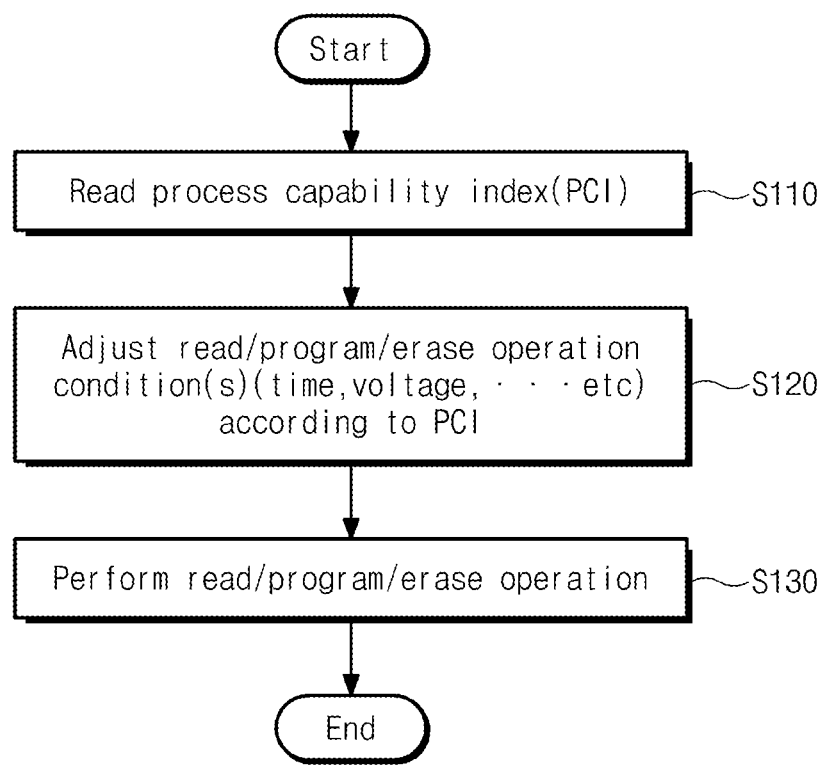
FIG. 16 is a flow chart schematically illustrating a method of driving a storage device, according to example embodiments of inventive concepts.

FIG. 16 is a flow chart schematically illustrating a method of driving a storage device 10, according to example embodiments of inventive concepts. Now will be described a method of driving a storage device 10 with reference to FIGS. 1 to 16. In step S110, a memory controller 200 determines a process capability index PCI for a nonvolatile memory device 100. For example, the memory controller 200 may read the process capability index PCI from the nonvolatile memory device 100. In step S120, operation condition(s) (e.g., programming, reading, or/and erasing conditions) are adjusted. In step S130, a program, read, and/or erase operation may be carried out according to the adjusted operation condition(s).

In a driving method according to example embodiments of inventive concepts, it is possible to adjust a condition of at least one of read, program, and erase operations according to a process capability index PCI.

Figure 17:
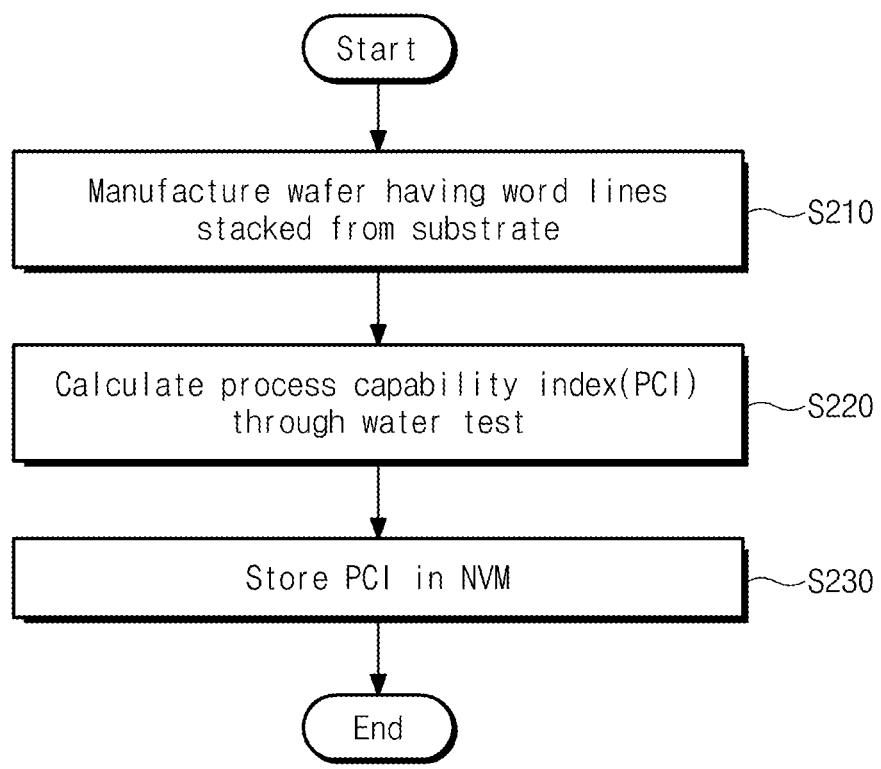
FIG. 17 is a flow chart schematically illustrating a method of storing a process capability index in a storage device according to example embodiments of inventive concepts.

FIG. 17 is a flow chart schematically illustrating a method of storing a process capability index PCI in a storage device 10 according to example embodiments of inventive concepts. Now will be described a method of storing a process capability index PCI with reference to FIGS. 1 to 17. In step S210, a test wafer may be manufactured which has word lines stacked from a substrate. In step S220, process capability indexes according to locations of the word lines may be calculated by testing the manufactured wafer. In step S230, the process capability indexes thus measured may be stored in a nonvolatile memory device 100 in a table format. Herein, a process capability index table 101 may be configured as described with reference to FIG. 10 (e.g., a group format). However, example embodiments of inventive concepts are not limited thereto.

In example embodiments, it is possible to store process capability indexes PCI, which a manufacturer measures/calculates from a test wafer, in a nonvolatile memory device 100.

Meanwhile, a technique of adjusting at least one operation condition according to a process capability index PCI has been described with reference to FIGS. 1 to 17. However, example embodiments of inventive concepts are not limited thereto. A storage device according to example embodiments of inventive concepts may adjust operation condition(s) based on a result of combining various environment information (e.g., an operation temperature, a deterioration level of an operation cell, operation structure related information, operation location related information, etc.) and a process capability index PCI.

Figure 18:
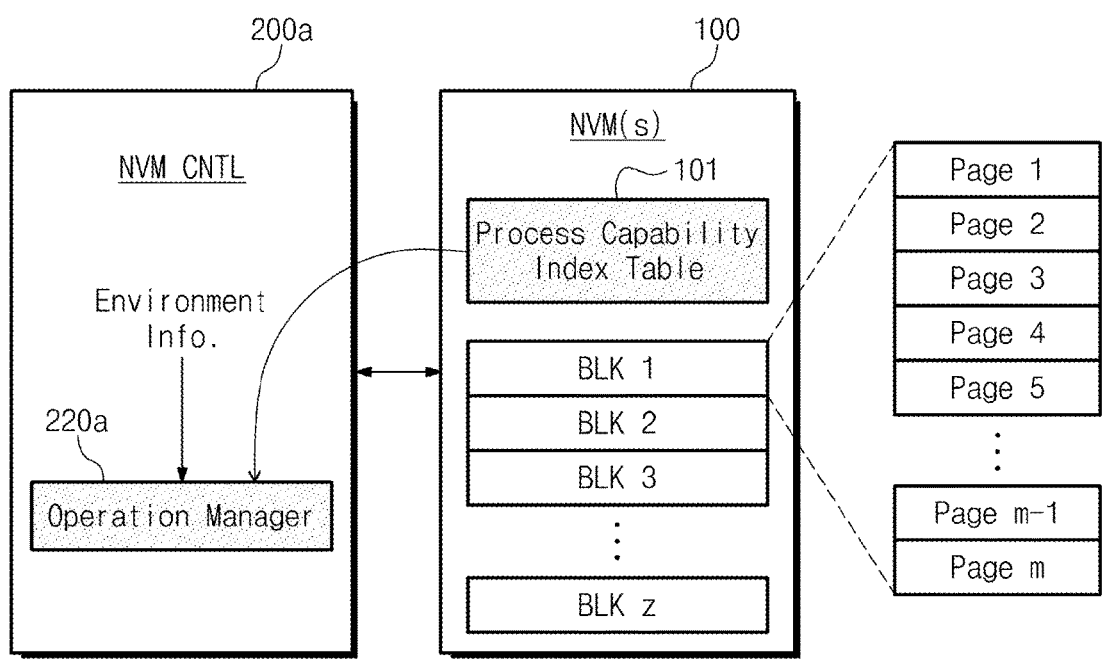
FIG. 18 is a block diagram schematically illustrating a storage device according to example embodiments of inventive concepts.

FIG. 18 is a block diagram schematically illustrating a storage device 20 according to example embodiments of inventive concepts. Referring to FIG. 18, a storage device 20 incorporates at least one nonvolatile memory device 100 and a memory controller 200a controlling the nonvolatile memory device 100. An operation of an operation manager 220a in FIG. 18 is different from that in FIG. 1. The memory controller 200a includes the operation manager 220a that adjusts an operation condition(s) using environment information and a process capability index PCI. In example embodiments, the environment information may include, but not limited to, temperature information, a deterioration level (e.g., P/E cycle, the number of operations, a deterioration index, and so on) and location information of a target—a memory block, a sub block, a word line, a bit line, or selection lines—where an operation is to be carried out.

In example embodiments, the operation manager 220a may select whether to reflect the environment information or the process capability index PCI to adjust an operation condition.

In example embodiments, a process capability index table 101 may include a process capability index and at least one compensation value (e.g., a voltage level, a time, and so on) of an operation condition corresponding to the process capability index.

The storage device 20 according to example embodiments of inventive concepts may adjust an operation condition(s) according to environment information or a process capability index PCI.

Meanwhile, a storage device 10 shown in FIG. 1 and a storage device 20 shown in FIG. 18 have been described under the condition that a process capability index PCI is stored in a nonvolatile memory device 100. However, example embodiments of inventive concepts are not limited thereto. For example, it is possible to store a process capability index PCI in a memory controller.

Figure 19:
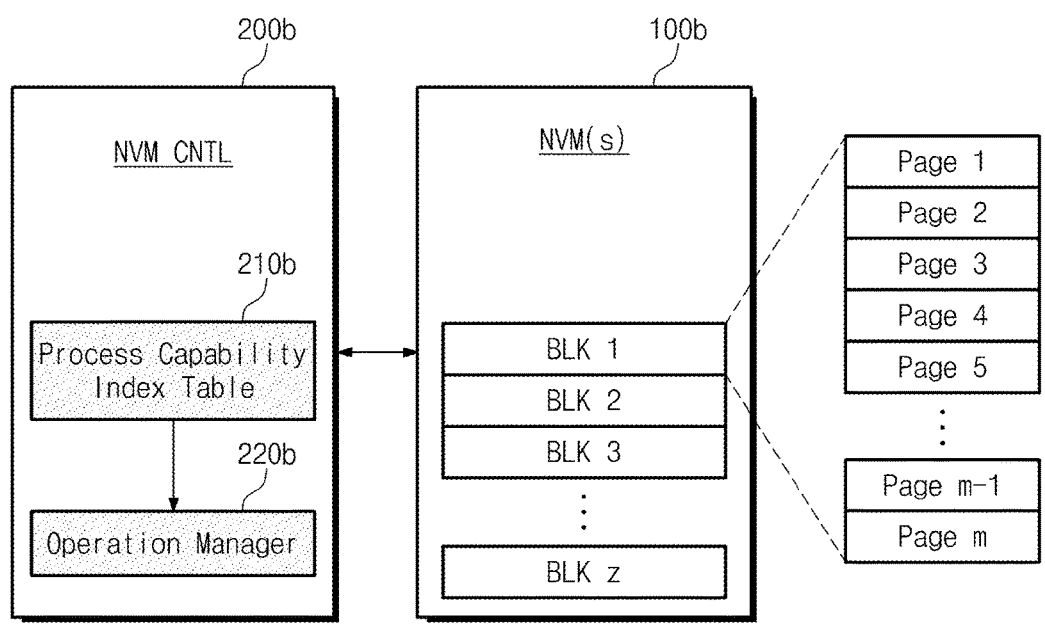
FIG. 19 is a block diagram schematically illustrating a storage device according to example embodiments of inventive concepts.

FIG. 19 is a block diagram schematically illustrating a storage device 30 according to example embodiments of inventive concepts. Referring to FIG. 19, a storage device 30 is different from a storage device 10 or 20 shown in FIG. 1 or 18 in that a memory controller 200b includes a process capability index table 210b. In example embodiments, the process capability index table 210b may be stored in a nonvolatile memory device (e.g., PRAM, ROM, and so on) of the memory controller 200b. An operation manager 220b may make compensation for a condition(s) of a read/program/erase operation using the process capability index table 210b.

Figure 20:
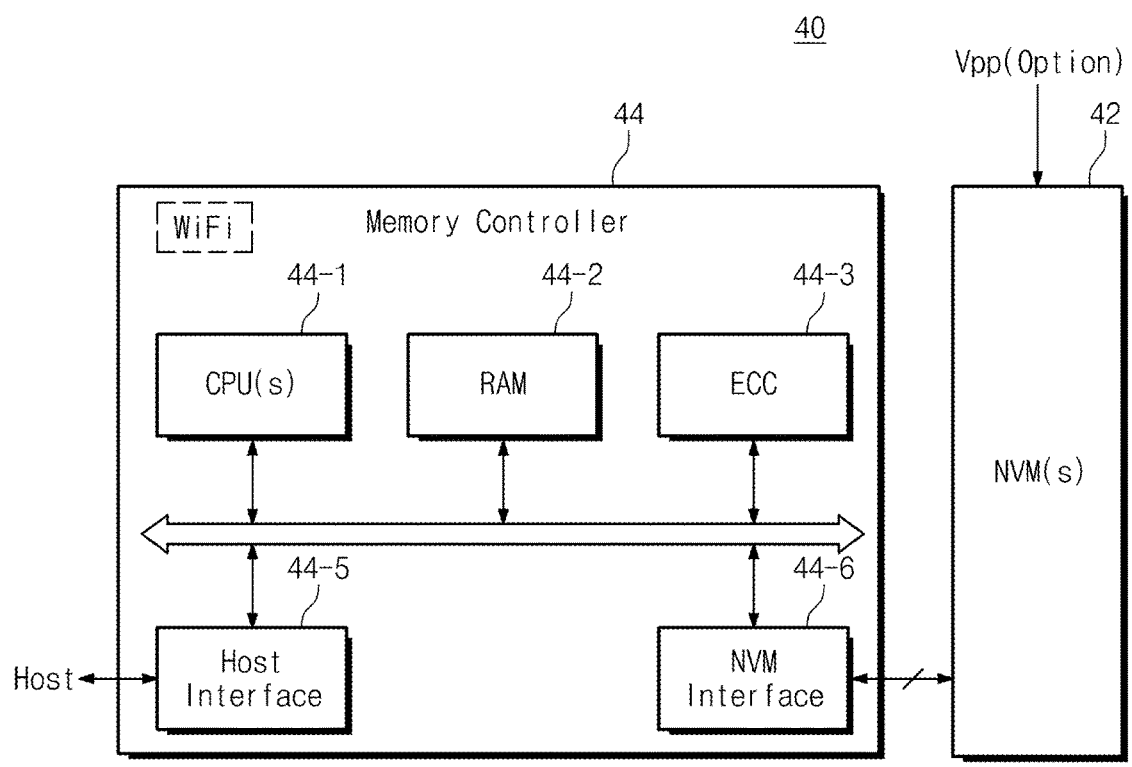
FIG. 20 is a block diagram schematically illustrating a storage device according to example embodiments of inventive concepts.

FIG. 20 is a block diagram schematically illustrating a storage device 40 according to example embodiments of inventive concepts. Referring to FIG. 20, a storage device 40 contains at least one nonvolatile memory device 42 and a memory controller 44 to control the nonvolatile memory device 42. The storage device 40 shown in FIG. 20 may be used as, but not limited to, a storage medium of a memory card (e.g., CF, SD, micro SD, and so on) or an USB storage device.

The nonvolatile memory device 42 may be implemented with a nonvolatile memory device 100 shown in FIG. 1 or 18 or a nonvolatile memory device 100b shown in FIG. 19. The memory controller 44 may be implemented with a memory controller 200 shown in FIG. 1, a memory controller 200a shown in FIG. 18, or a memory controller 200b shown in FIG. 19. The memory controller 44 may compensate for an operation condition(s) based on a process capability index PCI or at least one of environment information such as the number of program loops, an operation mode, pass/fail information of a specific program state, status information, temperature information, P/E cycle information, information associated with the number of operations, information associated with a physical structure of a word line, information associated with a physical location of a word line, location information, address information, selection/non-selection information, time information, and so on.

The memory controller 44 controls read, write, and erase operations of the nonvolatile memory device 42 in response to a host request. The memory controller 44 contains at least one central processing unit 44-1, a buffer memory 44-2, an ECC block 44-3, a host interface 44-5, and an NVM interface 44-6.

The central processing unit 44-1 controls an overall operation of the nonvolatile memory device 12 such as writing, reading, management of a file system, management of bad pages, and so on. The RAM 44-2 operates in response to a control of the central processing unit 44-1 and may be used as a work memory, a buffer memory, and a cache memory. If the RAM 44-2 is used as a work memory, data processed by the central processing unit 44-1 may be temporarily stored therein. If used as a buffer memory, the RAM 44-2 may be used to buffer data that is transferred from a host to the nonvolatile memory device 42 or from the nonvolatile memory device 42 to the host. As a cache memory, the RAM 44-2 may enable a low-speed nonvolatile memory device 42 to operate at high speed.

The ECC block 44-3 generates an error correction code ECC for correcting a fail bit or an error bit of data received from the nonvolatile memory device 42. The ECC block 44-3 performs error correction encoding on data to be provided to the nonvolatile memory device 42, so a parity bit may be added thereto. The parity bit may be stored in the nonvolatile memory device 42. The ECC block 44-3 performs error correction decoding on data output from the nonvolatile memory device 42. The ECC block 44-3 corrects an error using the parity. The ECC block 44-3 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), and so on.

The memory controller 44 exchanges data with the host through the host interface 44-5 and with the nonvolatile memory device 42 through the NVM interface 44-6. The host interface 44-5 may be connected with a host via PATA (Parallel AT Attachment bus), SATA (Serial AT attachment bus), SCSI, USB, PCIe, NAND interface, and so on.

In example embodiments, the memory controller 44 may be equipped with a wireless communication function (e.g., Wi-Fi).

The storage device 40 according to example embodiments of inventive concepts may perform an optimal program, read, and/or erase operation by compensating for an operation condition(s) according to a process capability index PCI.

Inventive concepts are applicable to a solid state drive (SSD).

Figure 21:
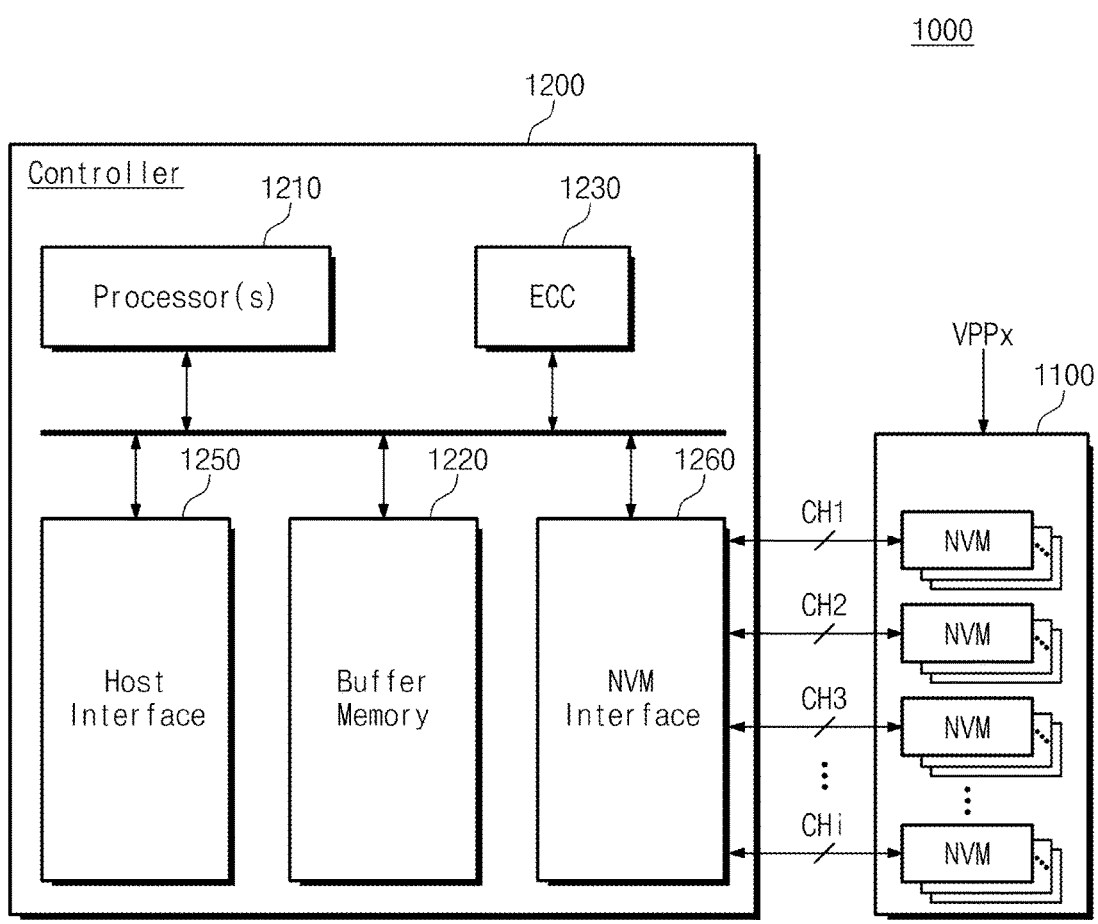
FIG. 21 is a block diagram schematically illustrating a solid state drive according to example embodiments of inventive concepts.

FIG. 21 is a block diagram schematically illustrating a solid state drive according to example embodiments of inventive concepts. Referring to FIG. 21, a solid state drive (hereinafter, referred to as SSD) 1000 includes a plurality of nonvolatile memory devices 1100 and an SSD controller 1200.

The nonvolatile memory devices 1100 may be implemented to be provided with an external high voltage VPPx optionally. The nonvolatile memory devices 1100 may be implemented with a nonvolatile memory device 100 described with reference to FIG. 1 or 18 or a nonvolatile memory device 100*b* described with reference to FIG. 19. The SSD controller 1200 is connected to the nonvolatile memory devices 1100 through a plurality of channels CH1 to CHi (i being an integer of 2 or more). The SSD controller 1200 may be implemented with a memory controller 200 described with reference to FIG. 1 or 18 or a memory controller 200*b* described with reference to FIG. 19. The SSD controller 1200 includes one or more processors 1210, a buffer memory 1220, an ECC block 1230, a host interface 1250, and a nonvolatile memory interface 1260.

The buffer memory 1220 stores data needed to drive the SSD controller 1200. In example embodiments, the buffer memory 1220 may include a plurality of memory lines each of which stores data or a command. The ECC block 1230 may be configured to calculate an ECC value of data to be programmed at a write operation, correct an error of read data according to an ECC value at a read operation, and correct an error of data restored from the nonvolatile memory device 1100 at a data restoration operation. Although not shown in FIG. 21, a code memory may be further included to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces. The nonvolatile memory interface 1260 provides an interface with the nonvolatile memory devices 1100.

The SSD 1000 according to example embodiments of inventive concepts compensates for an operation condition of a program, read, and/or erase operation based on a process capability index PCI, thereby improving the performance.

Inventive concepts are applicable to an eMMC (e.g., an embedded multimedia card, moviNAND, iNAND, etc.).

Figure 22:
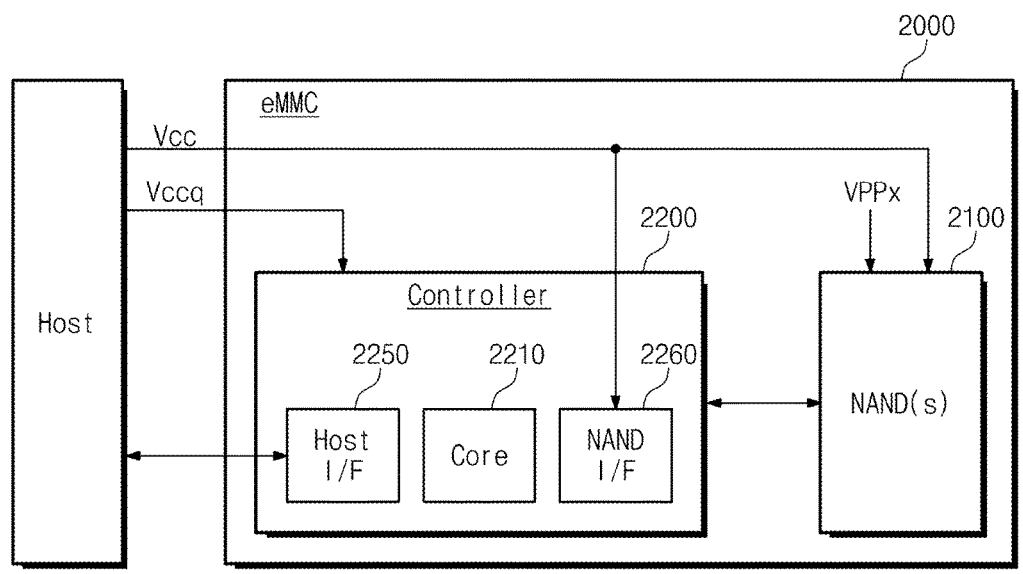
FIG. 22 is a block diagram schematically illustrating an eMMC according to example embodiments of inventive concepts.

FIG. 22 is a block diagram schematically illustrating an eMMC according to example embodiments of inventive concepts. Referring to FIG. 22, an eMMC 2000 includes one or more NAND flash memory devices 2100 and a controller 2200.

The NAND flash memory devices 2100 may be implemented with a nonvolatile memory device 100 described with reference to FIG. 1 or 18 or a nonvolatile memory device 100*b* described with reference to FIG. 19. The controller 2200 may be connected to the NAND flash memory device 2100 via a plurality of channels. The controller 2200 may be implemented with a memory controller 200 described with reference to FIG. 1 or 18 or a memory controller 200*b* described with reference to FIG. 19. The controller 2200 includes one or more controller cores 2210, a host interface 2250, and a NAND interface 2260. The controller core 2210 may control an overall operation of the eMMC 2000. The host interface 2250 may be configured to perform an interface between the controller 2200 and a host. The NAND interface 2260 may be configured to provide an interface between the NAND flash memory device 2100 and the controller 2200. In example embodiments, the host interface 2250 may be a parallel interface (e.g., MMC interface). In example embodiments, the host interface 2250 of the eMMC 2000 may be a serial interface (e.g., UHS-II, UFS interface, etc.).

The eMMC 2000 receives power supply voltages Vcc and Vccq from the host. Here, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In example embodiments, the eMMC 2000 may be optionally supplied with an external high voltage.

The eMMC 2000 according to example embodiments of inventive concepts performs a program, read, and/or erase operation based on a process capability index PCI corresponding to a location of a word line, thereby reducing an error rate and an operation time by the reduced error rate.

Inventive concepts are applicable to Universal Flash Storage UFS.

Figure 23:
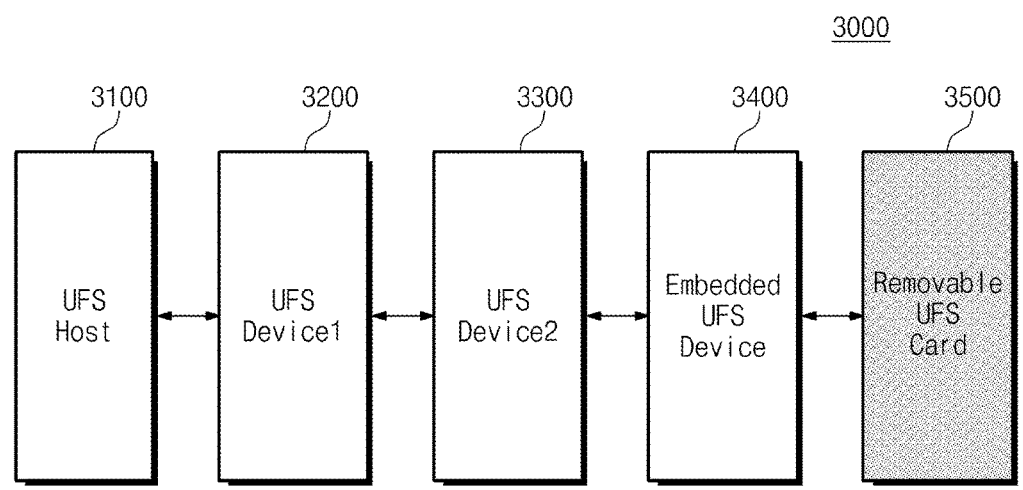
FIG. 23 is a block diagram schematically illustrating a UFS system according to example embodiments of inventive concepts.

FIG. 23 is a block diagram schematically illustrating a UFS system according to example embodiments of inventive concepts. Referring to FIG. 23, a UFS system 3000 includes a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may be implemented with a storage device 10 shown in FIG. 1, a storage device 20 shown in FIG. 18, or a storage device 30 shown in FIG. 19.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Inventive concepts are applicable to a mobile device.

Figure 24:
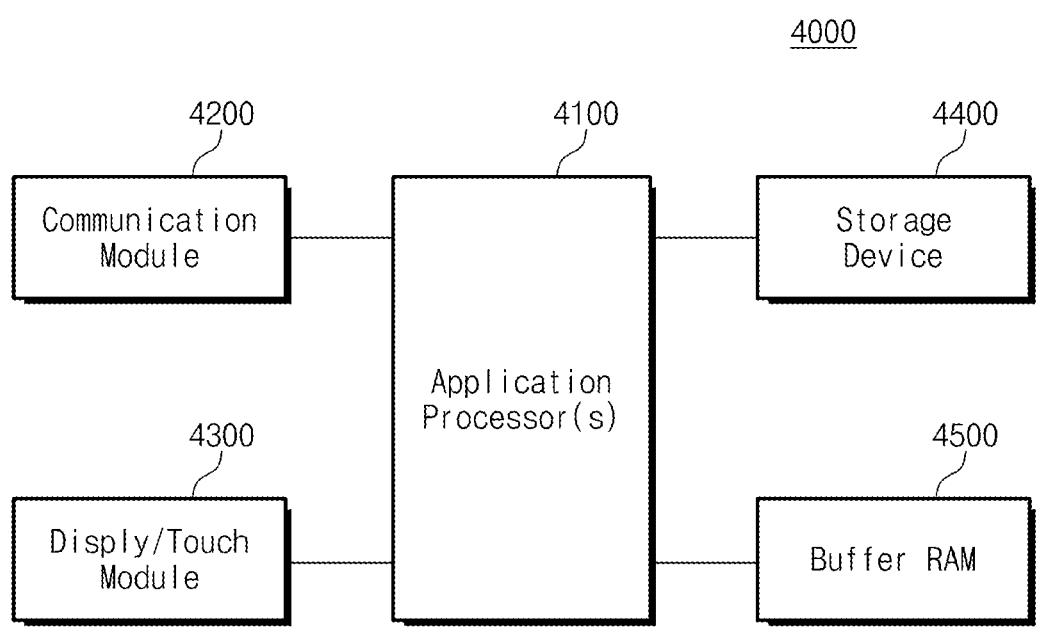
FIG. 24 is a block diagram schematically illustrating a mobile device 4000 according to example embodiments of inventive concepts.

FIG. 24 is a block diagram schematically illustrating a mobile device 4000 according to example embodiments of inventive concepts. Referring to FIG. 24, a mobile device 4000 includes an application processor 4100, a communication module 4200, a display/touch module 4300, a storage device 4400, and a buffer RAM 4500.

The application processor 4100 controls an overall operation of the mobile device 4000. The communication module 4200 may be implemented to perform wireless or wire communications with an external device. The display/touch module 4300 may be implemented to display data processed by the application processor 4100 or to receive data through a touch panel. The storage device 4400 may be implemented to store user data. The storage device 4400 may be, but not limited to, a memory card, an eMMC, an SSD, or an UFS device. The storage device 4400 may be implemented with a storage device 100 shown in FIG. 1. The storage device 4400 may be configured to perform an optimal program, read, and/or erase operation using a process capability index PCI as described with reference to FIGS. 1 to 20. The buffer RAM 4500 may be configured to temporarily store data necessary when the mobile device 4000 operates.

The mobile device 4000 according to example embodiments of inventive concepts performs a program, read, and/or erase operation based on a process capability index table, thereby reducing the performance of system.

In example embodiments of inventive concepts, a memory system and/or a storage device may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While some example embodiments have been particularly shown and described, it will be understood by one of ordinary skill in the art that variations in form and detail may be made therein without departing from the spirit and scope of the claims.

What is claimed is:

1. A nonvolatile memory device comprising:
a memory cell array including a plurality of strings spaced apart from each other on a substrate, each string including a plurality of memory cells stacked on each other between a ground select transistor and a string select transistor;
an address decoder connected to the strings through a plurality of word lines, each word line being connected to at least two of the memory cells at a same height of at least two of the strings; and
a control logic configured to receive operation condition adjustment information associated with a process capability index indicating how a structure of a channel of one of the plurality of strings deviates from a target shape, the control logic being configured to adjust at least one driving condition applied to the memory cell array according to the operation condition adjustment information.

2. The nonvolatile memory device of claim 1, wherein the process capability index indicates how a cross-sectional area of the one of the memory cells in the one of the strings of the memory cell array deviates from a target area.

3. The nonvolatile memory device of claim 1, wherein
the nonvolatile memory device is configured to store values for the process capability index in a table,
the table is divided into a plurality of groups according to the values for the process capability index.

4. The nonvolatile memory device of claim 1, wherein the control logic is configured to adjust one of a level of an applied voltage to the memory cell array and an application time of the applied voltage to the memory cell array according to the operation condition adjustment information.

5. A storage device, comprising:
the nonvolatile memory device according to claim 1; and
a memory controller, wherein
the memory controller is configured to read the process capability index from the nonvolatile memory device,
the memory controller is configured to provide the operation condition adjustment information to the control logic in response to the read process capability index.

6. A storage device comprising:
at least one nonvolatile memory device including a plurality of memory blocks on a substrate, each memory block including a plurality of strings on the substrate, the plurality of strings being perpendicular to the substrate and connected between bit lines and a common source line; and
a memory controller configured to compensate an operation condition of at least one of a program operation, a read operation, and an erase operation, based on a process capability index, the operation condition being one of an operation voltage and an operation time, the process capability index indicating how a structure of a channel of one of the plurality of strings, associated with a memory cell to be operated, deviates from a target shape.

7. The storage device of claim 6, wherein the storage device is configured to store the process capability index in a table format in the at least one nonvolatile memory device.

8. The storage device of claim 6, wherein the storage device is configured to store the process capability index in a table format in the memory controller.

9. The storage device of claim 6, wherein
the process capability index is based on reference process capability indexes determined from a test wafer, and
the reference process capability indexes correspond to locations of word lines in the test wafer.

10. The storage device of claim 6, wherein
the memory controller is configured to compensate for the operation condition based on the process capability index or environment information, and
the environment information includes at least one of an operation temperature, a deterioration degree of an operation cell, information associated with an operation structure, and information associated with an operation location.

11. A method of operating a storage device, the storage device including at least one nonvolatile memory device and a memory controller configured to control the at least one nonvolatile memory device, each nonvolatile memory device including a plurality of strings on a substrate, the strings being perpendicular to the substrate and connected between bit lines and a common source line, the method comprising:
reading a process capability index using the memory controller, the process capability index indicating how a structure of a channel of one of the plurality of strings, associated with a memory cell to be operated, deviates from a target shape;
adjusting at least one operation condition based on the process capability index; and
operating one of the at least one nonvolatile memory device according to the at least one operation condition adjusted.

12. The method of claim 11, wherein the reading the process capability index using the memory controller includes reading the process capability index from the one of the at least one nonvolatile memory device.

13. The method of claim 12, further comprising:
storing the process capability index in a table format in the one of at least one nonvolatile memory device.

14. The method of claim 11, wherein the process capability index is a value associated with a distance deviating from the target shape.

15. The method of claim 11, wherein the target shape is one of a circle and an oval if the structure associated with the memory cell to be operated is a channel of one of the plurality of strings in the one of the at least one nonvolatile memory device.

16. The method of claim 11, wherein the process capability index is a value associated with a size of an area deviating from the target shape.

17. The method of claim 11, wherein
the process capability index is managed using a table,
the table is divided into a plurality of groups according to a value of the process capability index, and
the table for managing the process capability index is determined using location information of word lines belonging to the plurality of groups.

18. The method of claim 17, wherein the adjusting at least one operation condition based on the process capability index includes:
adjusting one of an operation voltage and an operation time of at least one of a program operation, a read operation, and an erase operation according to each of the plurality of groups.

19. The method of claim 11, wherein the adjusting at least one operation condition based on the process capability index includes:
adjusting one of an operation voltage and an operation time of at least one of a program operation, a read operation, and an erase operation, based on the process capability index and at least one of an operation temperature, a deterioration degree of an operation cell, information associated with an operation structure, and information associated with an operation location.

* * * * *